(12) United States Patent
Lee

(10) Patent No.: US 11,871,570 B2
(45) Date of Patent: Jan. 9, 2024

(54) SEMICONDUCTOR DEVICE AND METHOD OF MANUFACTURING THE SAME

(71) Applicant: SK hynix Inc., Icheon-si (KR)

(72) Inventor: Jin Won Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/503,091

(22) Filed: Oct. 15, 2021

(65) Prior Publication Data

US 2022/0037359 A1 Feb. 3, 2022

Related U.S. Application Data

(62) Division of application No. 16/532,616, filed on Aug. 6, 2019, now Pat. No. 11,177,275.

(30) Foreign Application Priority Data

Nov. 21, 2018 (KR) .................. 10-2018-0144622

(51) Int. Cl.
*H10B 43/27* (2023.01)
*H01L 29/786* (2006.01)
(Continued)

(52) U.S. Cl.
CPC ....... *H10B 43/27* (2023.02); *H01L 29/78642* (2013.01); *H01L 29/78696* (2013.01);
(Continued)

(58) Field of Classification Search
CPC ......... H01L 29/78696; H01L 29/78642; H01L 27/11565; H01L 27/11582; H01L 27/1157;
(Continued)

(56) References Cited

U.S. PATENT DOCUMENTS 8,187,936 B2 5/2012 Alsmeier et al.
8,824,183 B2 9/2014 Samachisa et al.
(Continued)

FOREIGN PATENT DOCUMENTS

CN 106558591 A 4/2017
CN 108666324 A 10/2018
(Continued)

*Primary Examiner* — Vongsavanh Sengdara
(74) *Attorney, Agent, or Firm* — William Park & Associates Ltd.

(57) ABSTRACT

Provided herein are a semiconductor device and a method of manufacturing the semiconductor device. The semiconductor device includes an etch stop pattern having a top surface and a sidewall disposed over a gate stack having interlayer insulating layers alternately stacked with conductive patterns. The semiconductor device also includes a plurality of channel structures passing through the etch stop pattern and the gate stack. The semiconductor device further includes an insulating layer extending to cover the top surface and the sidewall of the etch stop pattern, wherein a depression is included in a sidewall of the insulating layer. The semiconductor device additionally includes a contact plug passing through the insulating layer so that the contact plug is coupled to a channel structure of the plurality of channel structures.

11 Claims, 21 Drawing Sheets

(51) Int. Cl.
*H10B 43/10* (2023.01)
*H10B 43/35* (2023.01)
*H10B 43/40* (2023.01)

(52) U.S. Cl.
CPC ............. *H10B 43/10* (2023.02); *H10B 43/35* (2023.02); *H10B 43/40* (2023.02)

(58) Field of Classification Search
CPC ... H01L 27/11573; H10B 43/27; H10B 43/40; H10B 43/35; H10B 43/10
See application file for complete search history.

(56) References Cited

U.S. PATENT DOCUMENTS

| | | | |
|---|---|---|---|
| 10,090,250 | B1 | 10/2018 | Lai et al. |
| 2010/0207195 | A1 | 8/2010 | Fukuzumi et al. |
| 2013/0161731 | A1* | 6/2013 | Bin .................. H01L 29/66833 438/269 |
| 2013/0313627 | A1 | 11/2013 | Lee et al. |
| 2014/0054789 | A1 | 2/2014 | Chiu et al. |
| 2014/0264542 | A1* | 9/2014 | Simsek-Ege ........ H01L 29/7889 438/287 |
| 2015/0179662 | A1 | 6/2015 | Makala et al. |
| 2015/0200203 | A1 | 7/2015 | Jang et al. |
| 2015/0287739 | A1* | 10/2015 | Lee ........................ H10B 43/40 438/269 |
| 2016/0148949 | A1 | 5/2016 | Jayanti et al. |
| 2016/0163729 | A1 | 6/2016 | Zhang et al. |
| 2017/0062457 | A1* | 3/2017 | Shin ........................ H10B 41/20 |
| 2017/0098655 | A1 | 4/2017 | Costa et al. |
| 2017/0110473 | A1* | 4/2017 | Lee .................. H01L 21/76897 |
| 2017/0117222 | A1 | 4/2017 | Kim et al. |
| 2017/0154892 | A1* | 6/2017 | Oh ........................ H10B 41/27 |
| 2017/0179148 | A1* | 6/2017 | Kwon .................... H10B 43/27 |
| 2017/0207226 | A1* | 7/2017 | Lee ........................ H10B 41/27 |
| 2017/0338241 | A1* | 11/2017 | Lee .................... H01L 27/0688 |
| 2018/0122742 | A1 | 5/2018 | Ha et al. |
| 2018/0277566 | A1 | 9/2018 | Iwata et al. |
| 2018/0286809 | A1* | 10/2018 | Lai ........................ H10B 43/35 |
| 2018/0286882 | A1 | 10/2018 | Tsuji et al. |
| 2018/0337191 | A1 | 11/2018 | Lai et al. |
| 2019/0013237 | A1 | 1/2019 | Nam et al. |

FOREIGN PATENT DOCUMENTS

| | | |
|---|---|---|
| KR | 1020160018921 A | 2/2016 |
| KR | 1020170036877 A | 4/2017 |
| KR | 1020170057060 A | 5/2017 |
| KR | 1020170083948 A | 7/2017 |

* cited by examiner

SEMICONDUCTOR DEVICE AND METHOD OF MANUFACTURING THE SAME

CROSS-REFERENCE TO RELATED APPLICATION

The present application is a divisional application of U.S. patent application Ser. No. 16/532,616, filed on Aug. 6, 2019, and claims priority under 35 U.S.C. § 119(a) to Korean patent application number 10-2018-0144622, filed on Nov. 21, 2018, in the Korean Intellectual Property Office, the entire disclosure of which is incorporated herein by reference.

BACKGROUND

1. Technical Field

Various embodiments of the present disclosure relate to a semiconductor device and a method of manufacturing the same, and more particularly, to a three-dimensional semiconductor device and a method of manufacturing the same.

2. Related Art

Generally, a semiconductor device may include a memory cell array including a plurality of memory cells. Memory cell arrays may include memory cells which are arranged in various structures. To increase the degree of integration of semiconductor devices, a three-dimensional semiconductor devices have been proposed. However, during a process of manufacturing a three-dimensional semiconductor device, a process failure may occur due to a variety of reasons. The process failure may reduce the operational reliability of the resultant semiconductor device or cause an operational failure of the semiconductor device.

SUMMARY

An embodiment of the present disclosure may provide for a semiconductor device that includes an etch stop pattern having a top surface and a sidewall disposed over a gate stack having interlayer insulating layers alternately stacked with conductive patterns. The semiconductor device also includes a plurality of channel structures passing through the etch stop pattern and the gate stack. The semiconductor device further includes an insulating layer extending to cover the top surface and the sidewall of the etch stop pattern, wherein a depression is included in a sidewall of the insulating layer. The semiconductor device additionally includes a contact plug passing through the insulating layer so that the contact plug is coupled to a channel structure of the plurality of channel structures.

An embodiment of the present disclosure may provide for a method of manufacturing a semiconductor device that includes forming a stack including first material layers and second material layers which are alternately stacked, forming an etch stop layer on the stack, and forming an insulating layer including vertical parts passing through the etch stop layer. The method also includes forming a slit extending to pass through the etch stop layer between the vertical parts that are adjacent to each other and extending to pass through the stack. The method further includes replacing the second material layers with line patterns through the slit.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be enabling and convey the scope of the example embodiments to those skilled in the art.

It will be understood that, although the terms "first," "second," etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between," "directly between," "adjacent to," or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof.

Embodiments of the present disclosure provide a semiconductor device which has improved operational reliability, and a method of manufacturing the semiconductor device.

Figure 1A:
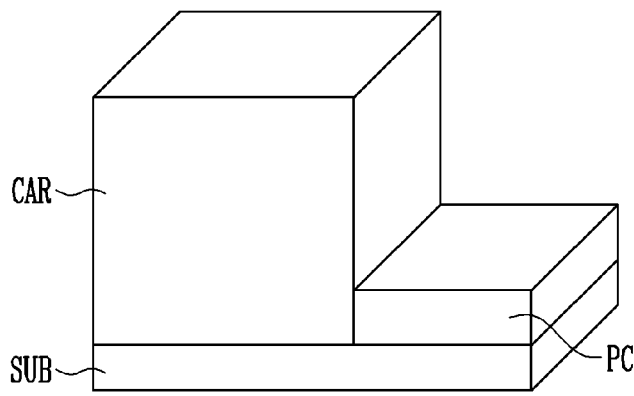
FIGS. 1A and 1B are diagrams schematically illustrating semiconductor devices, in accordance with embodiments.
Figure 1B:
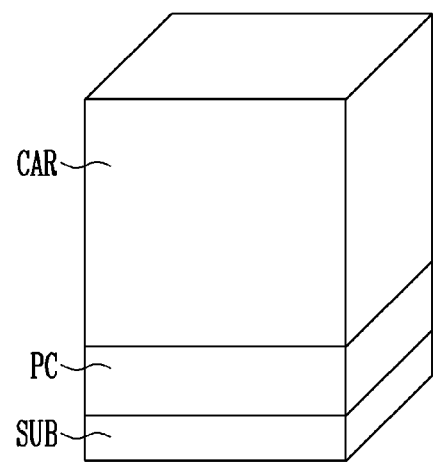

FIGS. 1A and 1B are diagrams schematically illustrating semiconductor devices, in accordance with embodiments.

Referring to FIGS. 1A and 1B, each of the semiconductor devices may include a peripheral circuit structure PC and a cell array CAR which are disposed over a substrate SUB.

The substrate SUB may be a single-crystal semiconductor layer. For example, the substrate SUB may be a bulk silicon substrate, a silicon-on-insulator substrate, a germanium substrate, a germanium-on-insulator substrate, a silicon-germanium substrate, or a thin epitaxial layer formed by a selective epitaxial growth method.

The cell array CAR may include a plurality of memory blocks. Each of the memory blocks may include a plurality of cell strings. Each of the cell strings may be electrically coupled to a bit line, a source line, word lines, and select lines. Each of the cell strings may include memory cells and select transistors which are coupled in series to each other. Each of the select lines may be used as a gate electrode of a select transistor corresponding thereto. Each of the word lines may be used as a gate electrode of a memory cell corresponding thereto.

The peripheral circuit structure PC may include N-type metal-oxide-semiconductor (NMOS) transistors and P-type metal-oxide-semiconductor (PMOS) transistors, a resistor, and a capacitor which are electrically coupled with the cell array CAR. The NMOS and PMOS transistors, the resistor, and the capacitor may be used as elements which form a row decoder, a column decoder, a page buffer, and a control circuit.

As illustrated in FIG. 1A, the peripheral circuit structure PC may be disposed on an area of the substrate SUB that does not overlap with the cell array CAR.

Alternatively, as illustrated in FIG. 1B, the peripheral circuit structure PC may be disposed between the cell array CAR and the substrate SUB. In this case, because the peripheral circuit structure PC overlaps with the cell array CAR, a surface area of the substrate SUB that is used to install the cell array CAR and the peripheral circuit structure PC may be reduced.

Figure 2:
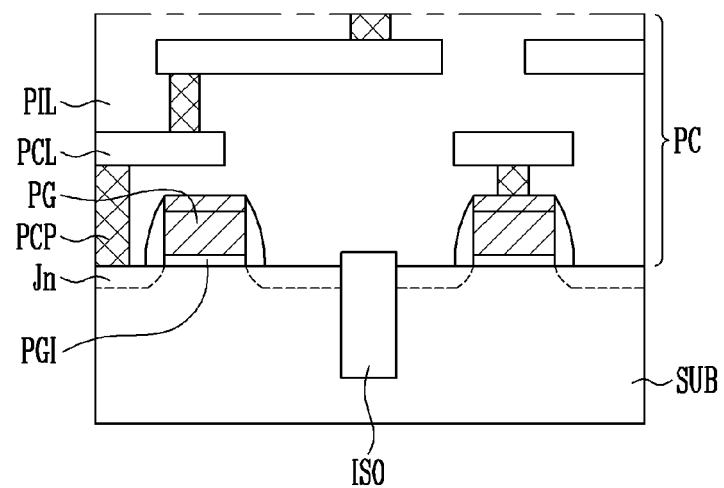
FIG. 2 is a sectional view schematically illustrating a peripheral circuit structure, in accordance with an embodiment.

FIG. 2 is a sectional view schematically illustrating a peripheral circuit structure PC in accordance with an embodiment. The peripheral circuit structure PC illustrated in FIG. 2 may be included in the peripheral circuit structure PC illustrated in FIG. 1A or included in the peripheral circuit structure PC illustrated in FIG. 1B.

Referring to FIG. 2, the peripheral circuit structure PC may include peripheral gate electrodes PG, a peripheral gate insulating layer PGI, junctions jn, peripheral circuit lines PCL, and peripheral contact plugs PCP.

The peripheral gate electrodes PG may be used as gate electrodes of an NMOS transistor and a PMOS transistor of the peripheral circuit structure PC. The peripheral gate insulating layer PGI may be disposed between each of the peripheral gate electrodes PG and the substrate SUB.

The junctions jn may be areas defined by injecting n-type or p-type impurities into respective active areas of the substrate SUB, and may be disposed on opposite sides of each of the peripheral gate electrodes PG and used as a source junction and a drain junction. The active area of the substrate SUB may be partitioned by an isolation layer ISO that is formed in the substrate SUB. The isolation layer ISO may be formed of insulating material.

The peripheral circuit lines PCL may be electrically coupled to a circuit of the peripheral circuit structure PC through the peripheral contact plugs PCP.

A peripheral circuit insulating layer PIL may cover the circuit of the peripheral circuit structure PC, the peripheral circuit lines PCL, and the peripheral contact plugs PCP. The peripheral circuit insulating layer PIL may include insulating layers that are stacked in a multilayer structure.

FIGS. 3A to 3E are perspective diagrams schematically illustrating semiconductor devices, in accordance with embodiments. In FIGS. 3A to 3E, illustration of insulating layers is omitted.

Referring to FIGS. 3A to 3E, a semiconductor device may include a plurality of memory strings CST. The memory strings CST may include memory cells and select transistors which are arranged along channel structures CH. For example, each of the memory strings CST may include memory cells and select transistors which are coupled in series by a corresponding channel structure CH. The memory cells of each memory string CST may be arranged in a three-dimensional structure so as to enhance the degree of integration of the semiconductor device.

Each of the channel structures CH may extend in a first direction I and be electrically coupled to a corresponding bit line BL. The bit line BL may extend in a second direction II on a horizontal plane intersecting with the first direction I. The bit line BL may be coupled to the corresponding channel structure CH via a contact plug DCT. The contact plug DCT may come into direct contact with the bit line BL and extend toward the corresponding channel structure CH.

Gates of memory cells and gates of select transistors may be coupled to conductive patterns CP1 to CPn which are stacked and spaced apart from each other in the first direction I. The conductive patterns CP1 to CPn may be used as word lines WL, source select lines SSL, and drain select lines DSL. The conductive patterns CP1 to CPn may be respectively disposed in first to n-th layers which are successively stacked in the first direction I and spaced apart from each other. The first layer may be defined as a layer that is farthest from the bit line BL. The n-th layer may be defined as a layer that is closest to the bit line BL.

The channel structures CH may protrude toward the bit line BL farther than n-th patterns CPn that are disposed in the n-th layer.

Referring to FIGS. 3A to 3D, at least the n-th patterns CPn of the conductive patterns CP1 to CPn may be used as the drain select lines DSL. The present disclosure is not limited to this. For example, conductive patterns that are disposed in two or more layers may be used as the drain select lines DSL. In the embodiment shown, the n-th patterns CPn and n−1-th patterns CPn−1 disposed in the n−1-th layer may be used as the drain select lines DSL.

At least first patterns CP1 disposed in the first layer among the conductive patterns CP1 to CPn may be used as the source select lines SSL. The present disclosure is not limited to this. For example, conductive patterns that are disposed in two or more layers may be used as the source select lines SSL. In the embodiment shown, the first patterns CP1 and second patterns CP2 disposed in the second layer may be used as the source select lines SSL.

Conductive patterns (e.g., CP3 to CPn−2) disposed between the drain select lines DSL and the source select lines SSL may be used as word lines WL.

Each of the conductive patterns CP1 to CPn may be divided into parts in the corresponding layer by a first slit SI1. Each of the drain select lines DSL may be divided into parts in the corresponding layer not only by the first slit SI1 but also by a second slit SI2. However, the present disclosure is not limited thereto. Although not illustrated, in an embodiment, each of the source select lines SSL may be divided into parts in the corresponding layer not only by the first slit SI1 but also by a third slit. Although not illustrated, in an embodiment, the second slit SI2 may be omitted.

The second slit SI2 or the third slit may overlap with the respective layers of the word lines WL. In an embodiment, the second slit SI2 or the third slit might not penetrate the word lines WL.

The first slit SI1 and the second slit SI2 may extend in a third direction III on the horizontal plane. The third direction III may be defined as a direction intersecting with the first direction I and the second direction II.

The channel structures CH that are shared by each of the word lines WL may be divided into two or more groups which are controlled by respective different drain select lines DSL. In an embodiment, the drain select lines DSL may include a first drain select line and a second drain select line which are separated from each other by the second slit SI2. In this case, the channel structures CH that are shared by each of the word lines WL may be divided into a first group which is controlled by the first drain select line, and a second group which is controlled by the second drain select line.

The word lines WL, the drain select lines DSL, and the source select lines SSL each may enclose one or more rows of channel structures CH in common.

The arrangement of the channel structures CH may form a zigzag shape. Embodiments of the present disclosure are not limited thereto. In an embodiment, the channel structures CH may be arranged parallel to each other in the second direction II and the third direction III.

The drain select lines DSL that are disposed in the same layer may be separated from each other by the first slit SI1 and the second slit SI2. Each of the word lines WL may extend to overlap the second slit SI2 without being penetrated by the second slit SI2. Although not illustrated, in an embodiment, the source select lines SSL that are disposed in the same layer may be separated from each other not only by the first slit SU but also by the third slit. In this case, each of the word lines WL may extend to overlap the third slit without being penetrated by the third slit.

Figure 3A:
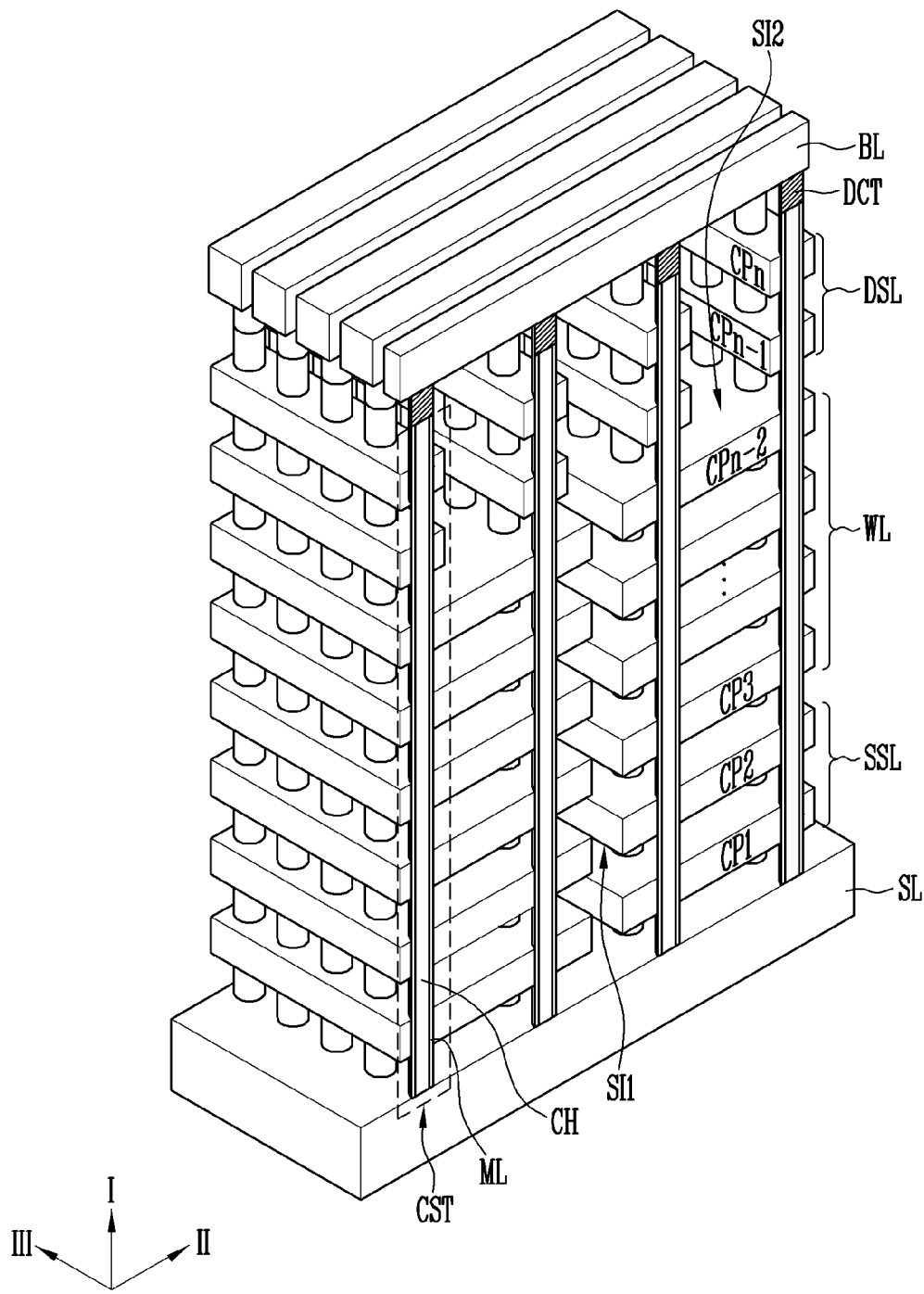
FIGS. 3A to 3E are perspective diagrams schematically illustrating semiconductor devices, in accordance with embodiments.
Figure 3B:
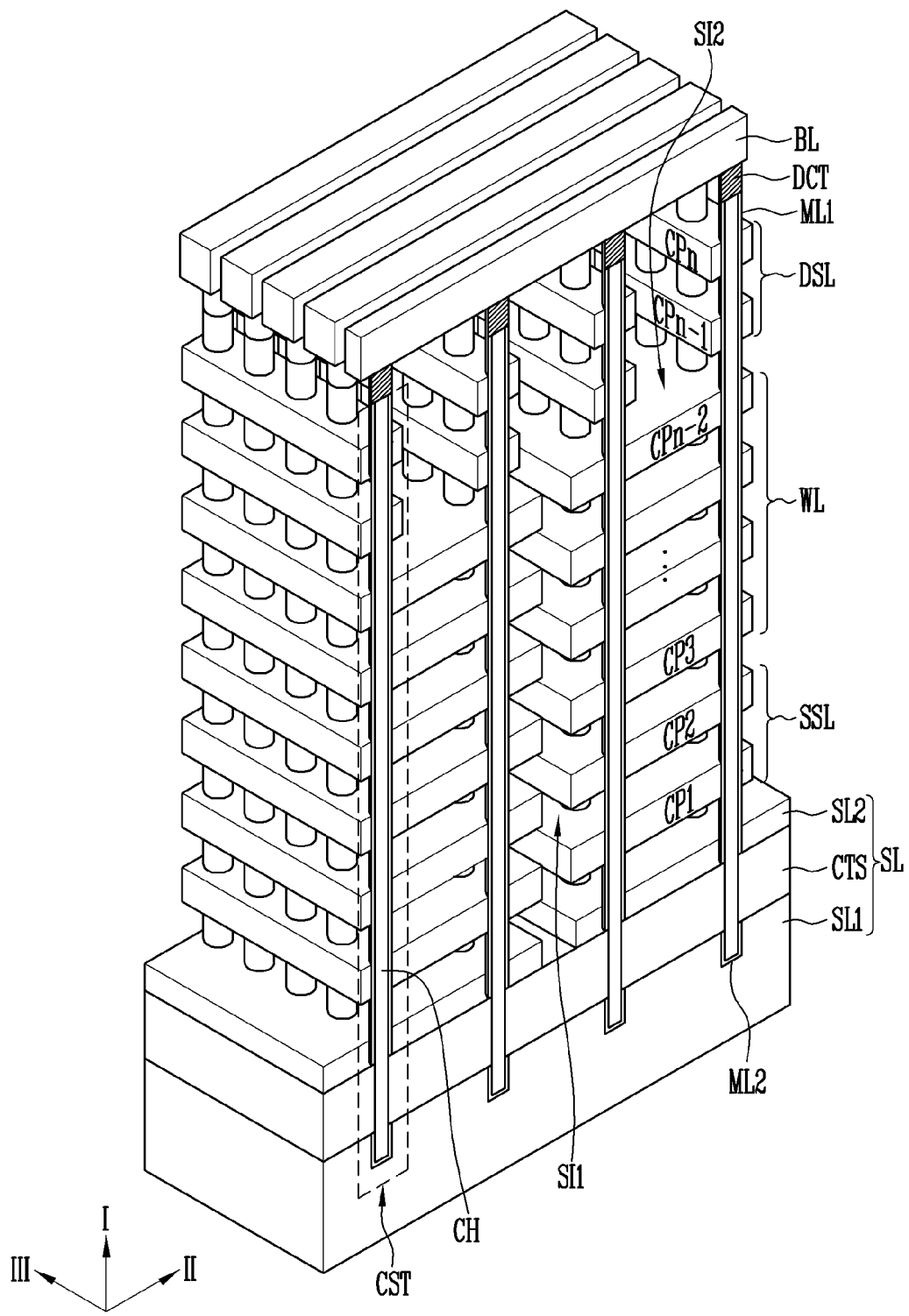
Figure 3C:
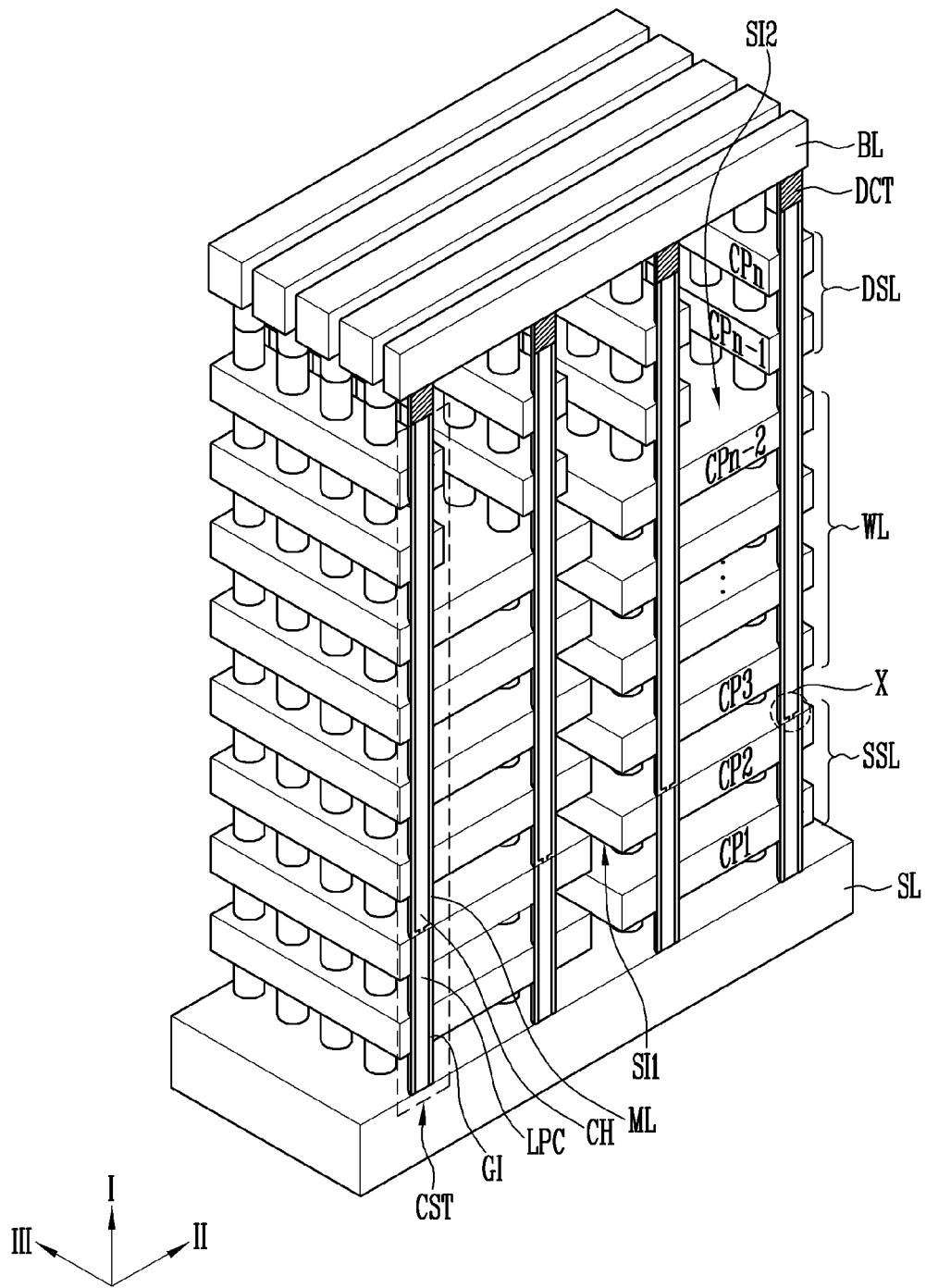
Figure 3D:
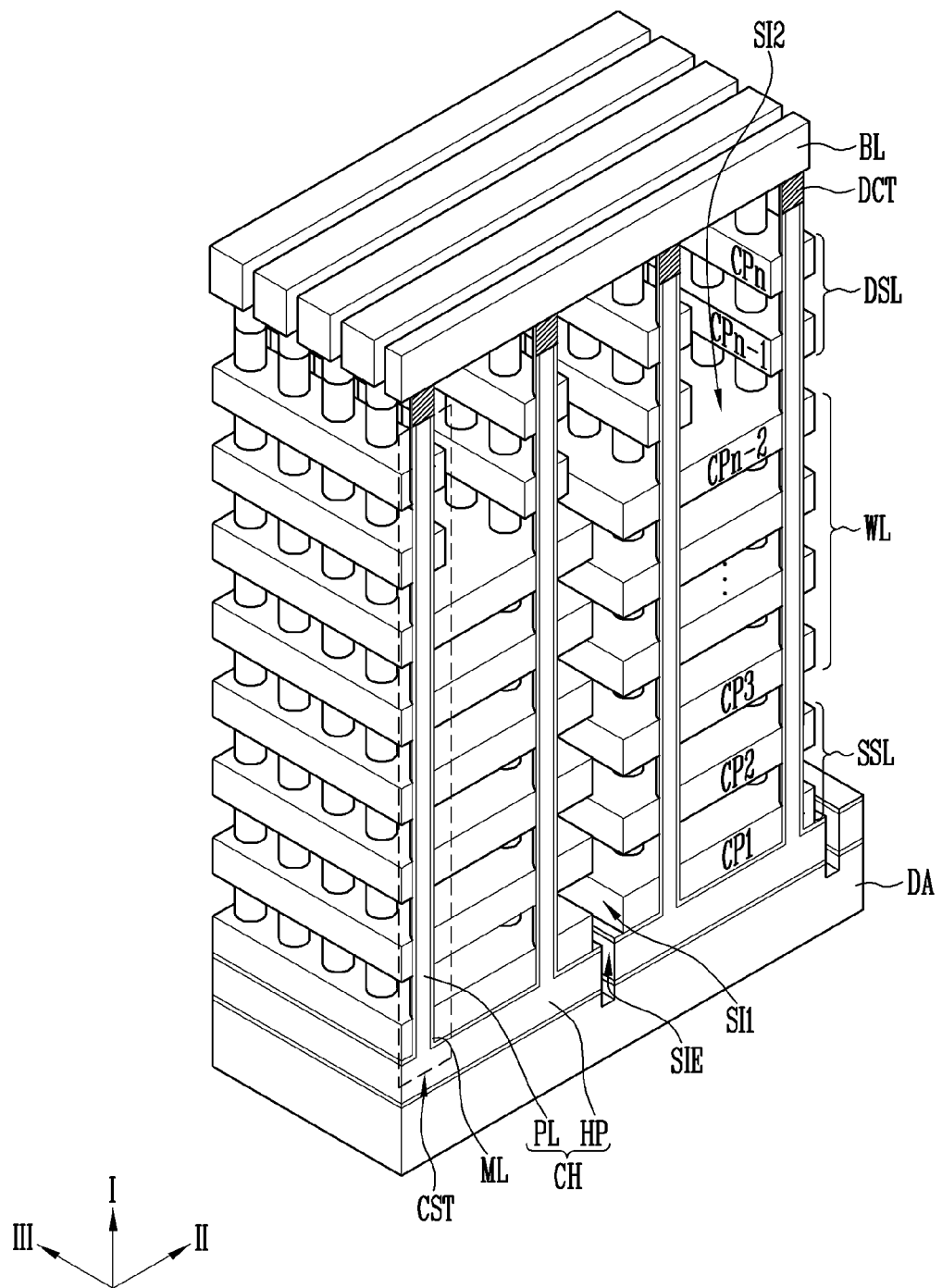

Referring to FIGS. 3A, 3B, and 3D, each of the channel structures CH may pass through the drain select lines DSL, the word lines WL, and the source select lines SSL. Referring to FIG. 3C, each of the channel structures CH may pass through the drain select lines DSL and the word lines WL.

Referring to FIGS. 3A and 3B, the channel structures CH may be directly coupled to a source layer SL disposed under the conductive patterns CP1 to CPn. The source layer SL may have various structures.

Referring to FIG. 3A, the source layer SL may come into contact with respective bottom surfaces of the channel structures CH. The source layer SL may be formed of a doped semiconductor layer including a source dopant. The source dopant may include n-type impurities. In an embodiment, the source layer SL may be formed by injecting the source dopant from the surface of the substrate SUB described with reference to FIG. 1A into the substrate SUB. In an embodiment, the source layer SL may be formed by depositing a doped semiconductor layer on the substrate SUB described with reference to FIG. 1B. In this case, an insulating layer may be disposed between the substrate SUB and the doped semiconductor layer. In an embodiment, the doped semiconductor layer may include doped silicon.

Each of the channel structures CH may come into contact with a top surface of the source surface SL, pass through the conductive patterns CP1 to CPn, and extend toward the bit line BL in the first direction I. A sidewall of each of the channel structures CH may be enclosed by a multilayer layer ML. The multilayer layer ML may extend along a sidewall of the corresponding channel structure CH. A top surface and the bottom surface of the channel structure CH may be open rather than being closed by the multilayer layer ML.

Referring to FIG. 3B, the channel structures CH may pass through the conductive patterns CP1 to CPn and extend into the source layer SL. A portion of the sidewall of each channel structure CH may come into contact with the source layer SL.

The source layer SL may include a first source layer SL1 and a contact source layer CTS. The source layer SL may further include a second source layer SL2. The channel structures CH may pass through the second source layer SL2 and the contact source layer CTS and extend into the first source layer SL1.

The first source layer SL1 may enclose each of lower ends of the channel layers CH. The first source layer SL1 may be formed of a doped semiconductor layer including a source dopant. The source dopant may include n-type impurities. In an embodiment, the first source layer SL1 may be formed by injecting the source dopant from the surface of the substrate SUB described with reference to FIG. 1A into the substrate SUB. In an embodiment, the first source layer SL1 may be formed by depositing a doped semiconductor layer on the substrate SUB described with reference to FIG. 1B. In this case, an insulating layer may be disposed between the substrate SUB and the doped semiconductor layer. In an embodiment, the doped semiconductor layer may include doped silicon.

The contact source layer CTS may be disposed on the first source layer SL1 and come into contact with a top surface of the first source layer SL1. The contact source layer CTS may come into contact with portions of the sidewalls of the channel structures CH and enclose the channel structures CH.

The multilayer layer that extends along the sidewall of each of the channel structures CH may be divided into a first multilayer pattern ML1 and a second multilayer pattern ML2 by the contact source layer CTS. The first multilayer pattern ML1 may be defined as a pattern which encloses an upper end of the corresponding channel structure CH. The second multilayer pattern ML2 may be defined as a pattern disposed between the first source layer SL1 and the corresponding channel structure CH.

The second source layer SL2 may be disposed between the contact source layer CTS and the source select line SSL. The second source layer SL2 may be formed to enclose the first multilayer pattern ML1. The second source layer SL2 may be omitted in some cases. The second source layer SL2 may be penetrated by the first slit SI1.

The contact source layer STS and the second source layer SL2 each may be formed of a doped semiconductor layer including a source dopant. The source dopant may include n-type impurities. In an embodiment, the doped semiconductor layer may include a doped silicon layer.

Figure 4:
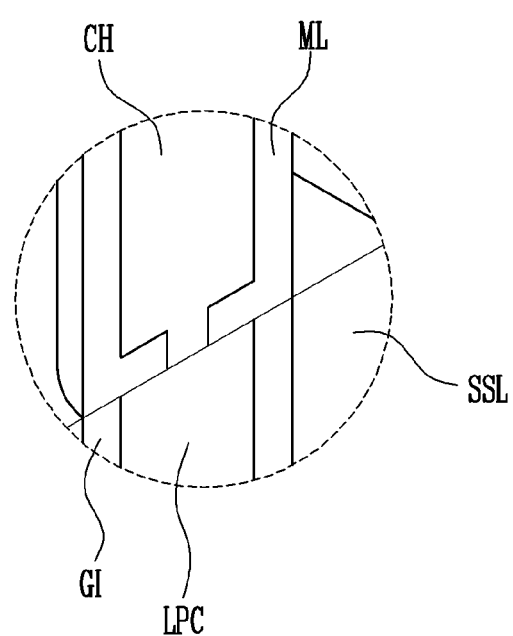
FIG. 4 is a diagram illustrating an enlargement of area X of FIG. 3C.

FIG. 4 is a diagram illustrating an enlargement of area X of FIG. 3C.

Referring to FIGS. 3C and 4, each of the channel structures CH may be coupled to a lower channel structure LPC corresponding thereto.

The lower channel structure LPC may be coupled to a lower end of the corresponding channel structure CH. Each of the channel structures CH may be enclosed by a multilayer layer ML. The multilayer layer ML may extend along a sidewall of the corresponding channel structure CH. A top surface and a bottom surface of the channel structure CH may be open rather than being closed by the multilayer layer ML.

The lower channel structure LPC may pass through at least one source select line SSL that is disposed below the word lines WL. A sidewall of the lower channel structure LPC may be enclosed by a gate insulating layer GI. The gate insulating layer GI may extend along a sidewall of the lower channel structure LPC. A top surface and a bottom surface of the lower channel structure LPC may be open rather than being closed by the gate insulating layer GI.

A source layer SL may come into contact with a bottom surface of the lower channel structure LPC. The source layer SL may be formed of the same material as that of the source layer SL described with reference to FIG. 3A.

Referring to FIG. 3D, each of the channel structures CH may include pillar parts PL which passes through the conductive patterns CP1 to CPn, and a horizontal part HP which horizontally extends from the pillar parts PL. The horizontal parts HP of the channel structures CH may extend parallel to bottom surfaces of the first patterns CP1. The horizontal parts HP may be separated from each other by a slit extension SIE which extends from the first slit SI1. A doped area DA may be disposed below the horizontal parts HP. In other words, the horizontal parts HP may be disposed between the doped area DA and the first patterns CP1.

In an embodiment, the doped area DA may be formed of a doped semiconductor layer including a well dopant. The well dopant may include p-type impurities. In an embodiment, the doped area DA may be formed by injecting the well dopant from the surface of the substrate SUB described with reference to FIG. 1A into the substrate SUB by a predetermined thickness. In an embodiment, the doped area DA may be formed by depositing a doped semiconductor layer on the substrate SUB described with reference to FIG. 1B. In this case, an insulating layer may be disposed between the substrate SUB and the doped semiconductor layer. In an embodiment, the doped semiconductor layer may include doped silicon.

A sidewall of each of the pillar parts PL may be enclosed by a multilayer layer ML. The multilayer layer ML may extend between the corresponding horizontal part HP and the first pattern CP1. The multilayer layer ML may extend between the corresponding horizontal part HP and the doped area DA.

Figure 3E:
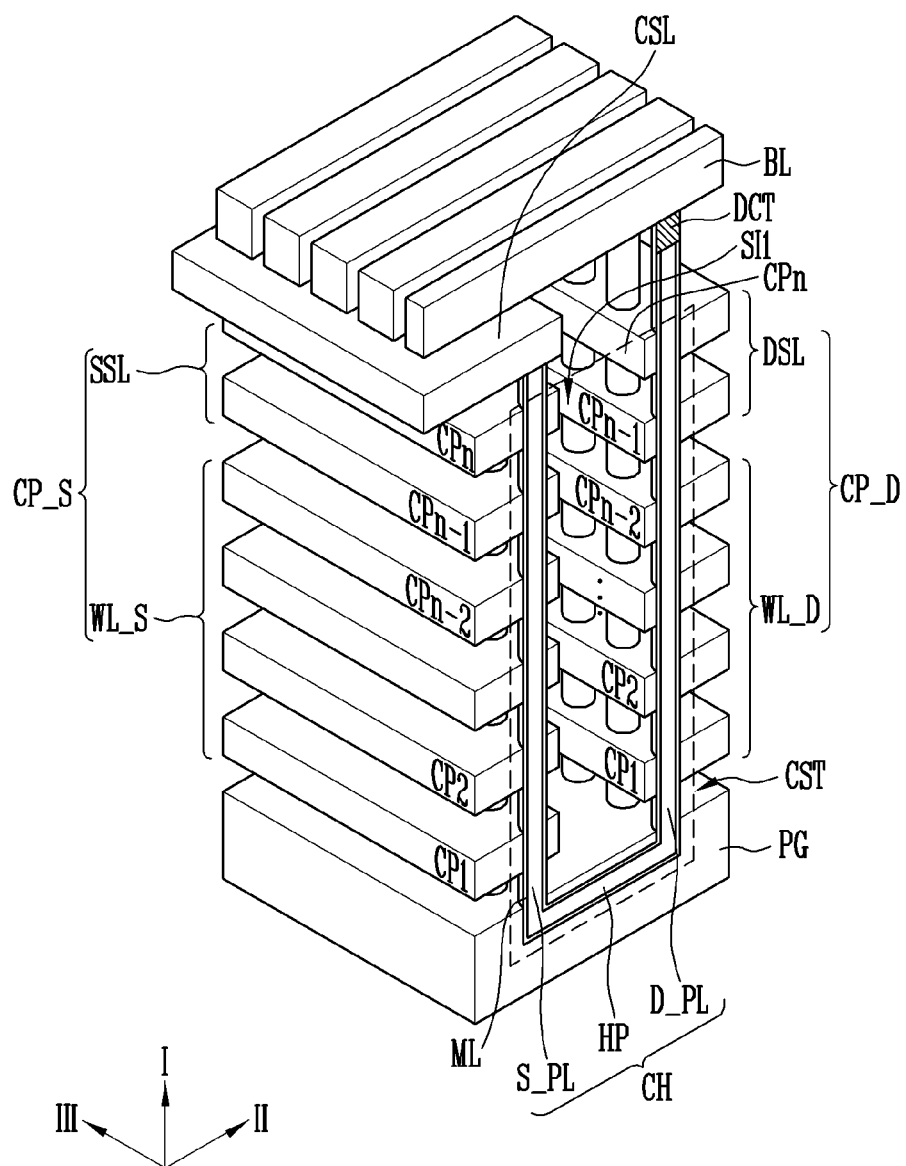

Referring to FIG. 3E, the conductive patterns CP1 to CPn may be divided into source-side conductive patterns CP_S and drain-side conductive patterns CP_D by the first slit SI1.

At least n-th source-side pattern CPn disposed in an n-th layer among the source-side conductive patterns CP_S may be used as a source select line SSL. The present disclosure is not limited to this. For example, conductive patterns that are disposed in two or more layers each may be used as a source select line SSL. In the embodiment shown, the n-th source-side pattern CPn and an n−1-th source-side pattern CPn−1 that are respectively disposed in the n-th layer and an n−1-th layer among the source-side conductive patterns CP_S each may be used as a source select line SSL. Conductive patterns (e.g., CP1 to CPn−2) that are disposed below the source select line SSL among the source-side conductive patterns CP_S may be used as source-side word lines WL_S.

At least n-th drain-side pattern CPn disposed in the n-th layer among the drain-side conductive patterns CP_D may be used as a drain select line DSL. The present disclosure is not limited to this. For example, conductive patterns that are disposed in two or more layers each may be used as a drain select line DSL. In the embodiment shown, an n-th drain-side pattern CPn and an n−1-th drain-side pattern CPn−1 that are respectively disposed in the n-th layer and the n−1-th layer among the drain-side conductive patterns CP_D each may be used as a drain select line DSL. Conductive patterns (e.g., CP1 to CPn−2) that are disposed below the drain select line DSL among the drain-side conductive patterns CP_D may be used as drain-side word lines WL_D.

A common source line CSL may be disposed over the source-side conductive patterns CP_S. The common source line CSL may disposed in a layer different from that of the bit lines BL. The common source line CSL and the bit lines BL may be formed of conductive material and spaced apart from each other. For example, the common source line CSL may be disposed between the bit lines BL and the source-side conductive patterns CP_S.

Each of the channel structures CH may include a source-side pillar S_PL, a drain-side pillar D_PL, and a horizontal part HP. The drain-side pillar D_PL may be electrically coupled to the corresponding bit line BL. The drain-side pillar D_PL may extend to pass through the drain-side conductive patterns CP_D and be coupled to the horizontal part HP. The source-side pillar S_PL may be electrically coupled to the common source line CSL. The source-side pillar S_PL may extend to pass through the source-side conductive patterns CP_S and be coupled to the horizontal part HP. The horizontal part HP may be embedded in a pipe gate PG. The source-side pillar S_PL and the drain-side pillar D_PL may extend from the horizontal part HP in the first direction I. The pipe gate PG may be disposed below the source-side conductive patterns CP_S and the drain-side conductive patterns CP_D, and formed to enclose the horizontal part HP. The pipe gate PG may be used as a gate of a pipe transistor. The pipe transistor may electrically couple the source-side pillar S_PL and the drain-side pillar D_PL through the horizontal part HP in response to a signal transmitted to the pipe gate PG.

An outer surface of each of the channel structures CH may be enclosed by a multilayer layer ML. The multilayer layer ML may extend along the outer surfaces of the drain-side pillar D_PL, the horizontal part HP, and the source-side pillar S_PL of the corresponding channel structure CH.

The first slit SI1 may be formed between the source-side conductive patterns CP_S and the drain-side conductive patterns CP_D that are adjacent to each other in the second direction II, and may extend in the third direction III. Each of the source-side conductive patterns CP_S, the drain-side conductive patterns CP_D, and the common source line CSL may be formed in a linear shape extending in the third direction III.

The word lines WL, WL_D, and WL_S described with reference to FIGS. 3A to 3E may be used as gates of memory cells. Each of the drain select lines DSL may be used as a gate of a drain select transistor. Each of the source select lines SSL may be used as a gate of a source select transistor. The multilayer layer ML, ML1, and ML2 may include a data storage layer for storing data.

Each of the channel structures CH illustrated in FIGS. 3A to 3E may include an upper end which protrudes toward the corresponding bit line BL over the n-th patterns CPn. The distance between each contact plug DCT and the corresponding n-th pattern CPn may be proportional to the length of the upper end of the corresponding channel structure CH. The length of the upper end of each channel structure CH may be designed with various values according to a design rule of the semiconductor device, taking into account a process margin.

A process failure due to misalignment of each contact plug DCT may be prevented by an etch stop pattern formed to enclose the upper end of the channel structure CH. The etch stop pattern which encloses the upper end of each channel structure CH is described with reference to FIGS. 5A and 5B.

Figure 5A:
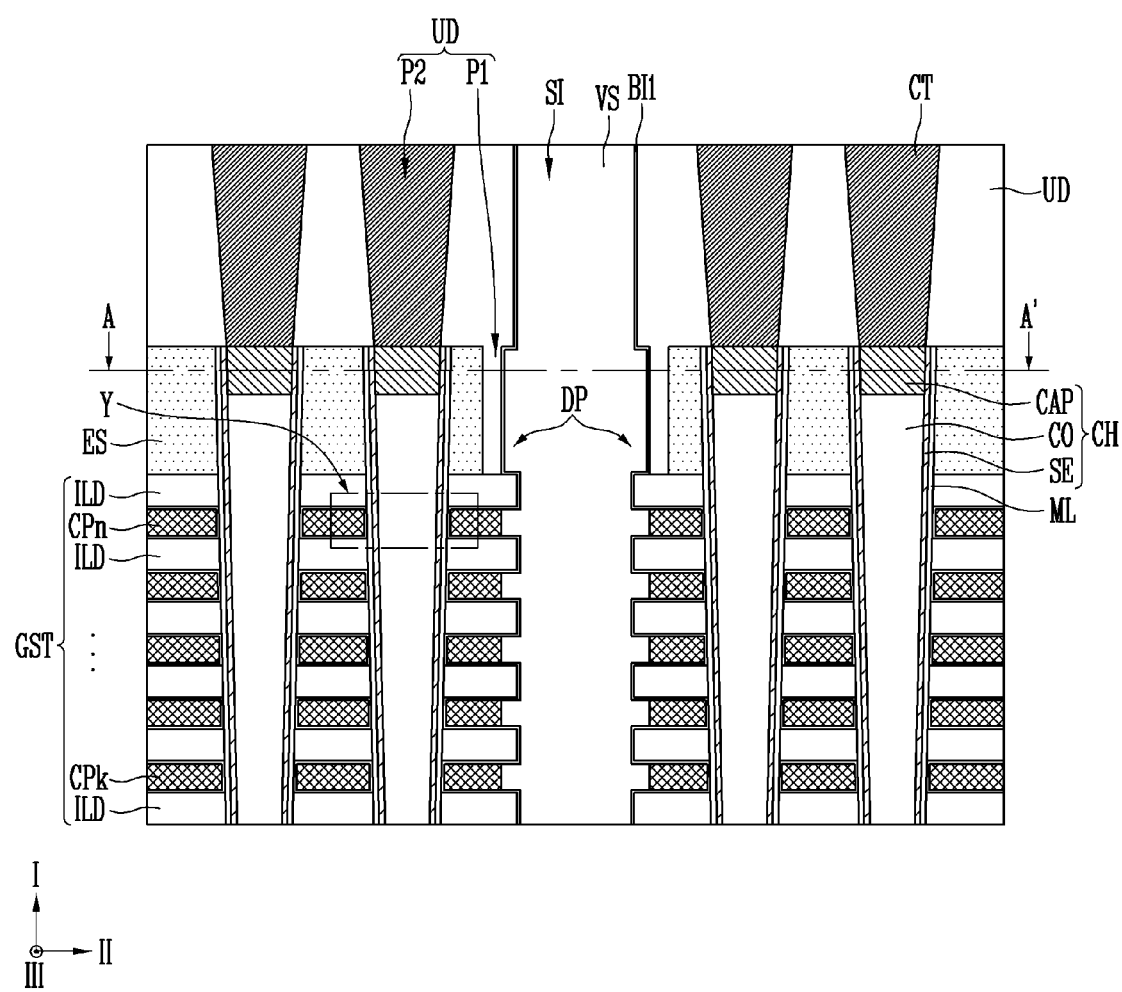
FIGS. 5A and 5B are various sectional views illustrating a semiconductor device, in accordance with an embodiment.
Figure 5B:
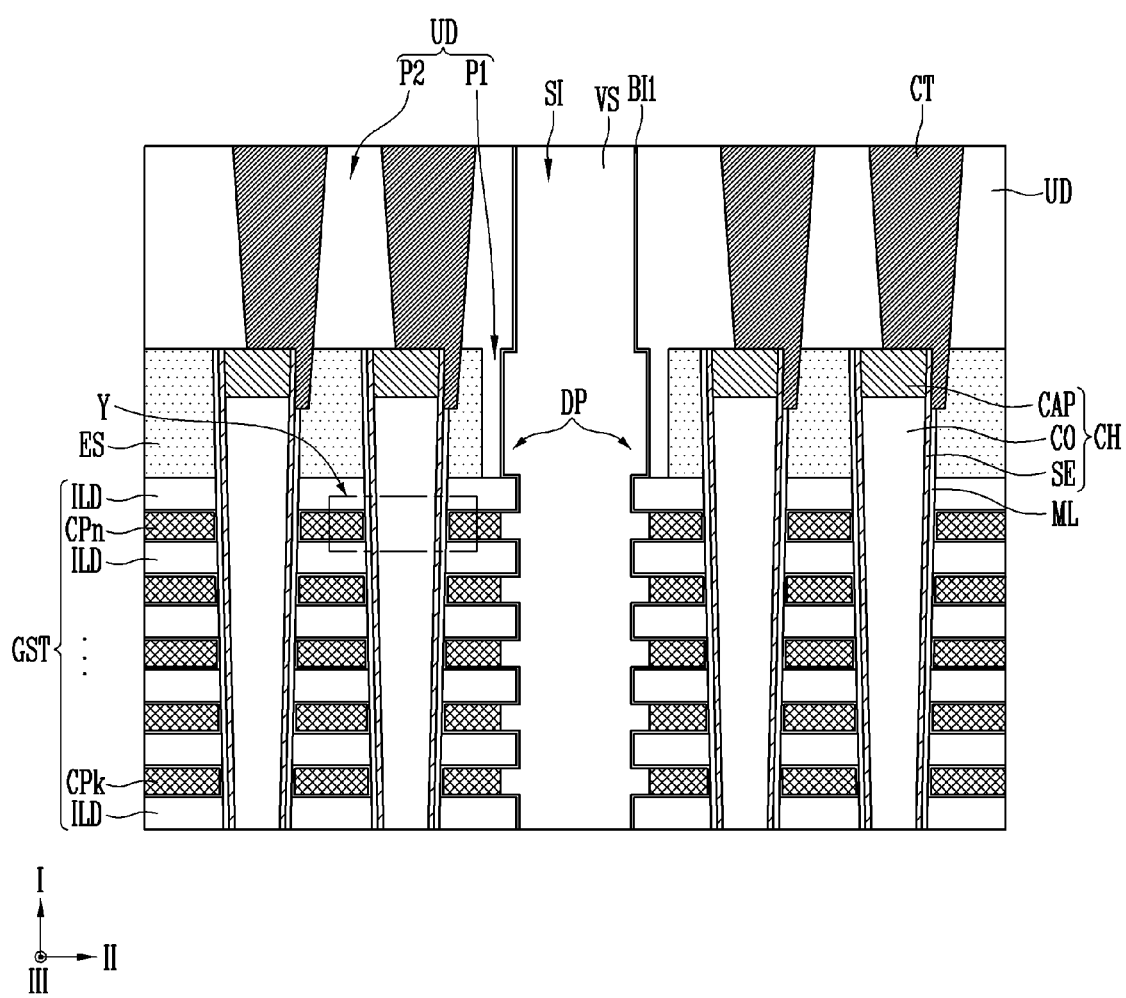

FIGS. 5A and 5B are various sectional views illustrating the semiconductor device in accordance with an embodiment.

Referring to FIGS. 5A and 5B, the semiconductor device may include gate stacks GST. The gate stacks GST may be disposed under etch stop patterns ES. In other words, the etch stop patterns ES may be disposed on the gate stacks GST. Each of the gate stacks GST may include interlayer insulating layers ILD and conductive patterns CPk to CPn which are alternately stacked in the first direction I. Each of FIGS. 5A and 5B illustrates interlayer insulating layers ILD and conductive patterns CPk to CPn that form an upper portion of each of the gate stacks GST. The conductive patterns CPk to CPn illustrated in each of FIGS. 5A and 5B may correspond to a k-th pattern CPk to the n-th pattern CPn of the conductive patterns CP1 to CPn illustrated in each of FIGS. 3A to 3E. The k-th pattern CPk may be a pattern disposed in a k-th layer among the conductive patterns CP1 to CPn illustrated in each of FIGS. 3A to 3E. Each of the gate stacks GST in accordance with an embodiment of the present disclosure may further include the first pattern CP1 to a k−1-th pattern CPk−1 disposed in a k−1-th layer among the conductive patterns CP1 to CPn illustrated in each of FIGS. 3A to 3E.

Each of the conductive patterns CPk to CPn may include a gate conductive layer. For example, the gate conductive layer may include at least one of a doped silicon layer, a metal silicide layer, and a metal layer. For instance, the metal layer may include a low-resistance metal such as tungsten, nickel, or cobalt to provide a low-resistance gate conductive layer. The gate conductive layer may further include a barrier layer. The barrier layer may be a layer for preventing metal from diffusing from the metal layer, and may include, e.g., a metal nitride layer. For example, the metal nitride layer may include titanium nitride, a tantalum nitride layer, etc.

The interlayer insulating layer ILD may include oxide, e.g., silicon oxide.

Gate stacks GST that are adjacent to each other in the second direction II may be separated from each other by a slit SI. The second direction II may be a direction which is parallel to the horizontal plane intersecting with the first direction I. The interlayer insulating layers ILD and the conductive patterns CPk to CPn each may extend in the second direction II and the third direction III. The third direction III may be a direction which is parallel to the horizontal plane intersecting with the first direction I and intersects with the second direction II.

The etch stop patterns ES and the gate stacks GST may be penetrated by the channel structures CH. Each of the channel structures CH may be enclosed by the corresponding etch stop pattern ES and the corresponding gate stack GST. Each of the channel structures CH may protrude over the n-th pattern CPn and have an upper end enclosed by the corresponding etch stop pattern ES.

The gate stacks GST may protrude in a lateral direction farther than etch stop patterns ES. The gate stacks GST may protrude toward the slit SI farther than etch stop patterns ES. For example, the interlayer insulating layer ILD and the conductive patterns CPk to CPn each may protrude toward the slit SI farther than the etch stop patterns ES.

The etch stop patterns ES may be enclosed by an upper insulating layer UD. The upper insulating layer UD may include oxide. For example, the oxide may include silicon oxide. The etch stop patterns ES may include material having an etching rate different from that of the interlayer insulating layers ILD and the upper insulating layer UD. For example, the etch stop patterns ES may include nitride. For example, the nitride may include silicon nitride.

The upper insulating layer UD may extend to cover each of top surfaces and each of sidewalls of the etch stop patterns ES. The upper insulating layer UD may include sidewalls extending toward the slit SI. Depressions DP may be formed in the sidewalls of the upper insulating layer UD. The depressions DP may overlap the upper ends of the channel structures CH that pass through the etch stop patterns ES. As shown, for example, the overlap occurs in the second direction II.

The upper insulating layer UD may include vertical parts P1 and horizontal parts P2. The vertical parts P1 of the upper insulating layer UD may be respectively disposed on the sidewalls of the etch stop patterns ES that face the slit SI. The horizontal parts P2 may extend from the vertical parts P1 to cover the top surfaces of the etch stop patterns ES.

The horizontal parts P2 and the gate stacks GST may protrude toward the slit SI farther than the vertical parts P1. In other words, the horizontal parts P2 may protrude farther than the vertical parts P1 and the gate stacks GST in a lateral direction intersecting with the first direction I. In the above-described structure, the depressions DP of the upper insulating layer UD may be respectively defined in the sidewalls of the vertical parts P1.

The semiconductor device may further include a first blocking insulating layer BI1. The first blocking insulating layer BI1 may extend along interfaces between the interlayer insulating layers ILD and the conductive patterns CPk to CPn. The first blocking insulating layer BI1 may extend to cover the sidewalls of the conductive patterns CPk to CPn that face the channel structures CH. Each of the surfaces of the horizontal parts P2 that protrude farther than the vertical parts P1, and may be covered by the corresponding first blocking insulating layer BI1. Each of sidewalls of the vertical parts P1 may be covered by the corresponding first blocking insulating layer BI1.

The first blocking insulating layer BI1 may include insulating material having a high dielectric constant. For example, the first blocking insulating layer BI1 may include a metal oxide. For instance, the metal oxide may include aluminum oxide. The first blocking insulating layer BI1 may be omitted for some embodiments.

The slit SI may be filled with a vertical structure VS. The vertical structure VS may extend to cover the sidewalls of the gate stacks GST and the sidewalls of the upper insulating layer UD, and include protrusions which protrude toward the depressions DP.

In an embodiment, the vertical structure VS may include insulating material filling the slit SI. In an embodiment, the vertical structure VS may include a sidewall insulating layer and a vertical conductive pattern. The sidewall insulating layer may extend to cover the sidewall of the slit SI, and the vertical conductive pattern may fill a central area of the slit SI defined by the sidewall insulating layer.

In the case where the first blocking insulating layer BI1 is formed, the vertical structure VS may be formed on the first blocking insulating layer BI1.

The horizontal parts P2 of the upper insulating layer UD may be penetrated by the contact plugs CT. Each of the contact plugs CT may correspond to the contact plug DCT illustrated in each of FIGS. 3A to 3E. Each of the contact plugs CT may be coupled to the corresponding channel structure CH. The contact plugs CT may include conductive material.

Each of the channel structures CH may include a core insulating layer CO, a semiconductor layer SE, and a capping pattern CAP. The core insulating layer CO may include insulating material, e.g., oxide. The semiconductor layer SE may extend along a sidewall of the core insulating layer CO to cover the core insulating layer CO. The semiconductor layer SE may be used as a channel through which charges move. For example, the semiconductor layer SE may include silicon. The core insulating layer CO may be formed to a height lower than that of the semiconductor layer SE. The semiconductor layer SE may protrude in the first direction I farther than the core insulating layer CO. The capping pattern CAP may be disposed on the core insulating layer CO, and enclosed by an upper end of the semiconductor layer SE that protrudes farther than the core insulating layer CO. The capping pattern CAP may come into contact with the semiconductor layer SE. The capping pattern CAP may include a doped semiconductor layer doped with a dopant. For example, the doped semiconductor layer may include doped silicon. The capping pattern CAP may include an n-type dopant. The contact plugs CT may be coupled to the corresponding capping patterns CAP. The capping pattern CAP may be used as a junction.

The multilayer layer ML that encloses each of the channel structures CH may extend along the sidewall of the corresponding channel structure CH.

During alignment of the contact plugs CT, as illustrated in FIG. 5A, central axes of the contact plugs CT may be aligned with central axes of the corresponding channel structures CH without an alignment error. Unlike this, during the alignment of the contact plugs CT, as illustrated in FIG. 5B, the contact plugs CT may be biased to one side of the channel structures CH due to misalignment.

During a process of manufacturing the semiconductor device, the slit SI may open, and the etch stop layer for the etch stop patterns ES may be exposed through the slit SI. A portion of the etch stop layer that has been exposed through the slit SI may be removed to form the depressions DP during the process of manufacturing the semiconductor device. Even when the etch stop layer is partially removed after the slit SI has opened, the other portion of the etch stop layer that is protected by the vertical parts P1 of the upper insulating layer UD may remain as the etch stop patterns ES.

During a process of etching the upper insulating layer UD to form the contact plugs CT, the n-th pattern CPn may be prevented, by a difference in etching rate between the etch stop patterns ES and the upper insulating layer UD, from being exposed. For example, as illustrated in FIG. 5B, in the case where misalignment of the contact plugs CT occurs, a portion of each of the etch stop patterns ES may be etched while the upper insulating layer UD is etched. However, because the etch stop patterns ES have high resistance to etch material for etching the upper insulating layer UD, it is difficult for the etch stop patterns ES to be completely penetrated by the contact plugs CT. Therefore, in an embodiment of the present disclosure, a punch phenomenon due to misalignment of the contact plugs CT may be mitigated.

Figure 6:
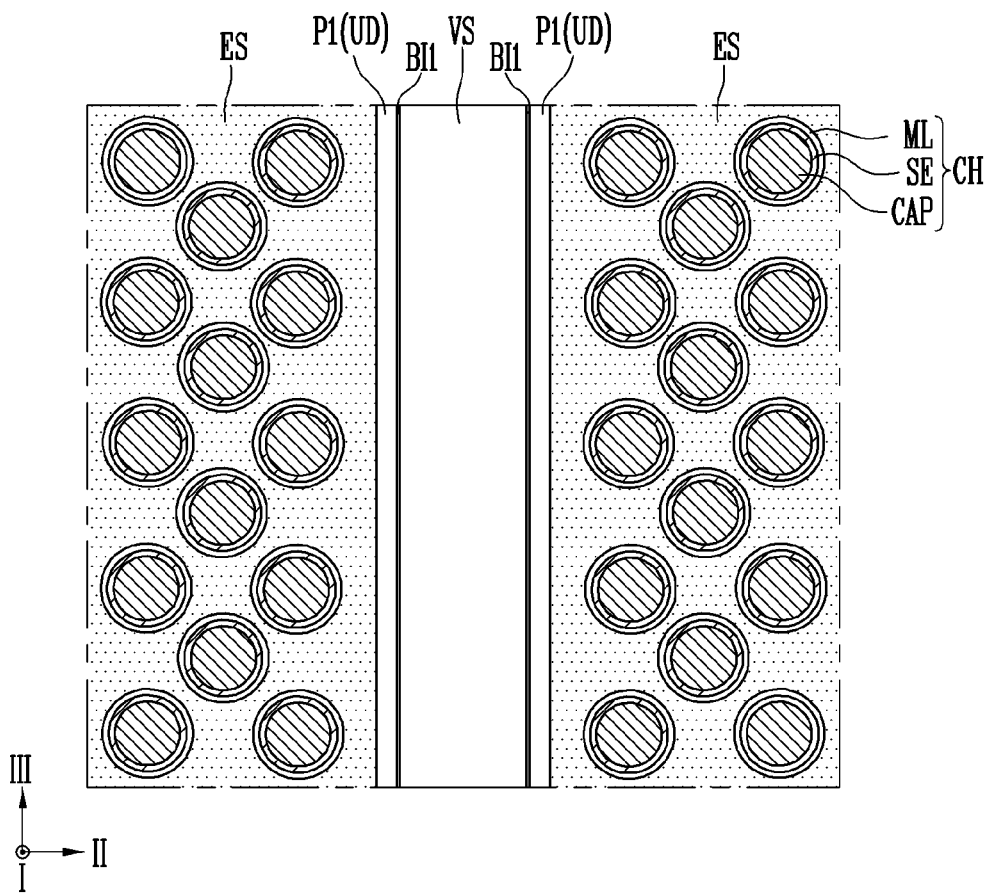
FIG. 6 is a plan view illustrating a layout of vertical parts of an upper insulating layer and a layout of etch stop patterns, in accordance with an embodiment.

FIG. 6 is plan view illustrating a layout of the vertical parts P1 of the upper insulating layer UD and a layout of the etch stop patterns ES in accordance with an embodiment. FIG. 6 is a cross-sectional view of the semiconductor device, taken along line A-A' of FIG. 5A.

Referring to FIG. 6, each of the etch stop patterns ES may extend along the second direction II and the third direction III which intersect with each other on the horizontal plane intersecting with the first direction I. The vertical parts P1 and the vertical structure VS each may extend in a linear shape along the third direction III. The vertical parts P1 may face each other with the vertical structure VS interposed therebetween. The first blocking insulating layer BI1 may extend along an interface between the corresponding vertical part P1 and the vertical structure VS.

The channel structures CH that pass through each of the etch stop patterns ES may be arranged in a zigzag manner along the second direction II and the third direction III. Embodiments of the present disclosure are not limited thereto. The channel structures CH that pass through each of the etch stop patterns ES may be arranged parallel to each other along the second direction II and the third direction III.

Each of the channel structures CH may have a circular cross-sectional surface, as shown. Embodiments of the present disclosure are not limited thereto. For example, the cross-sectional shape of each of the channel structures CH may change in various ways to have, e.g., a triangular, rectangular, polygonal, or elliptical shape. Each of the channel structures CH may include a capping pattern CAP enclosed by the semiconductor layer SE and may be enclosed by the multilayer layer ML.

Figure 7:
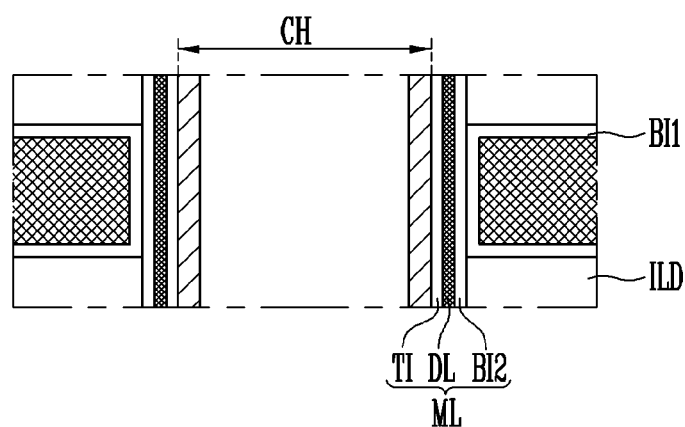
FIG. 7 is a sectional view illustrating an enlargement of area Y of each of FIGS. 5A and 5B.

FIG. 7 is a sectional view illustrating an enlargement of area Y of each of FIGS. 5A and 5B.

Referring to FIG. 7, the multilayer layer ML may extend along an interface between the corresponding channel structure CH and the corresponding gate stack GST. The multilayer layer ML may include a tunnel insulating layer TI surrounding the corresponding channel structure CH, a data storage layer DL surrounding the tunnel insulating layer TI, and a second blocking insulating layer BI2 surrounding the data storage layer DL.

The data storage layer DL may be formed of a charge trap layer, a material layer including conductive nanodots, or a phase-change material layer.

The data storage layer DL may store data to be changed using Fowler-Nordheim tunneling caused by a difference in voltage between the corresponding channel structure CH and the word lines of the conductive patterns CPk to CPn illustrated in FIG. 5A or 5B. To this end, the data storage layer DL may be formed of silicon nitride capable of trapping charges.

The data storage layer DL may store data based on an operation principle other than the Fowler-Nordheim tunneling. For example, the data storage layer DL may be formed of a phase-change material layer and may store data in response to a phase change.

The second blocking insulating layer BI2 may include an oxide capable of blocking charges. The tunnel insulating layer TI may include silicon oxide making charge tunneling possible.

Any one of the first blocking insulating layer BI1 and the second blocking insulating layer BI2 may be omitted, for some embodiments.

Although not illustrated, for some embodiments, at least one of the tunnel insulating layer TI and the data storage layer DL may extend along an interface between the first blocking insulating layer BI1 and the interlayer insulating layer ILD and an interface between the channel structure CH and the first blocking insulating layer BI1.

FIGS. 8, 9A, 9B, 10A, 10B, 11A to 11C, 12A, and 12B are diagrams illustrating a method of manufacturing a semiconductor device in accordance with an embodiment.

Figure 8:
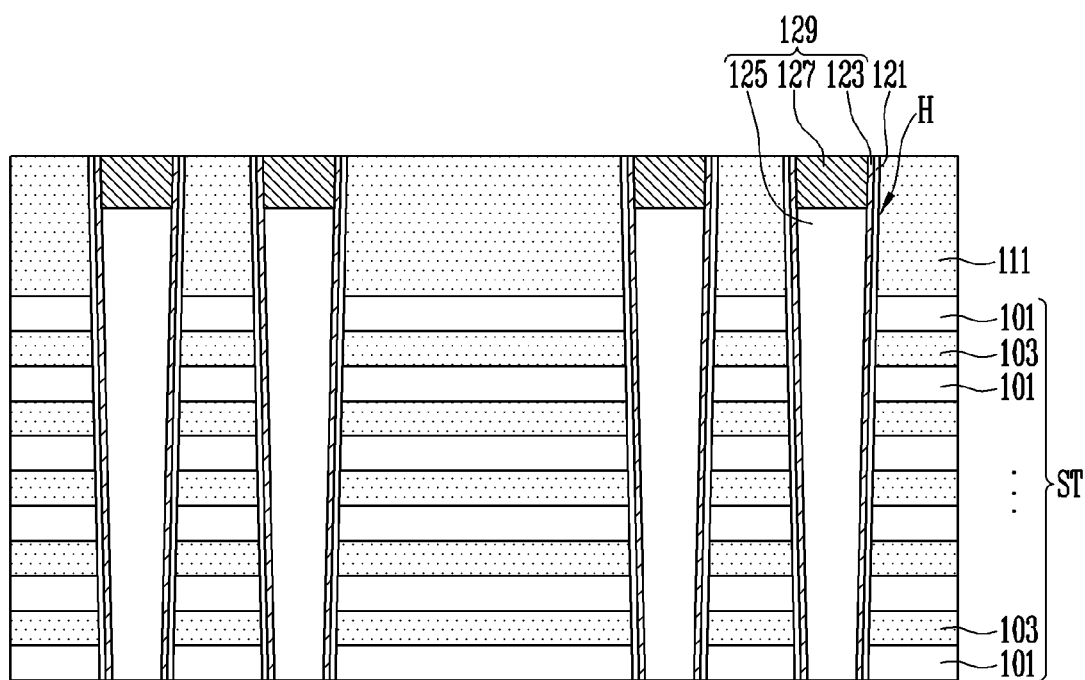
FIGS. 8, 9A, 9B, 10A, 10B, 11A to 11C, 12A, and 12B are diagrams illustrating a method of manufacturing a semiconductor device, in accordance with an embodiment.

FIG. 8 illustrates channel structures 129 which pass through a preliminary stack ST and an etch stop layer 111.

Referring to FIG. 8, the preliminary stack ST may be formed by alternately stacking first material layers 101 and second material layers 103. The first material layers 101 may be insulating material for the interlayer insulating layers ILD illustrated in FIG. 5A or 5B. The second material layers 103 may have an etching rate different from that of the first material layers 101. For example, each of the first material layers 101 may include oxide such as a silicon oxide layer, and each of the second material layers 103 may include nitride such as a silicon nitride layer. An uppermost material layer of the first material layers 101 may be disposed in an uppermost layer of the preliminary stack ST.

The etch stop layer 111 may be formed on the preliminary stack ST. The etch stop layer 111 may have an etching rate different from that of the first material layers 101. For example, the etch stop layer 111 may include the same material as the second material layers 103. For example, the etch stop layer 111 and the second material layers 103 each may include nitride.

The step of forming the channel structures 129 may include the step of forming holes H which pass through the preliminary stack ST, and the step of filling the holes H with the respective channel structures 129. The step of forming the channel structures 129 may further include the step of forming a multilayer layer ML on a sidewall of the corresponding hole H before the channel structures 129 are formed. In this case, each of the channel structures 129 may be formed on the corresponding multilayer layer 121.

The step of forming the multilayer layer 121 may include the step of successively stacking a blocking insulating layer, a data storage layer, and a tunnel insulating layer from the sidewall of each hole H toward the central area of each hole H. The blocking insulating layer may include insulating layer capable of blocking charges. For example, the blocking insulating layer may include oxide. The data storage layer may be formed of a charge trap layer, a material layer including conductive nanodots, or a phase-change material layer. For example, the data storage layer may include silicon nitride. The tunnel insulating layer may include insulating material making charge tunneling possible. For example, the tunnel insulating layer may include silicon oxide.

Each of the channel structures 129 may include a semiconductor layer 123, a core insulating layer 125, and a capping pattern 127. The semiconductor layer 123 may be conformally formed along the sidewall of each hole H. For example, the semiconductor layer 123 may be formed by depositing a silicon layer. The central area of each hole H defined by the semiconductor layer 123 may be filled with the core insulating layer 125 and the capping pattern 127.

The core insulating layer 125 may include oxide. The height of the core insulating layer 125 may be controlled to be lower than the height of each hole H. To control the height of the core insulating layer 125, portion of the core insulating layer 125 in the hole H may be removed.

The capping pattern 127 may be disposed on the core insulating layer 125 and enclosed by an upper end of the semiconductor layer 123. The capping pattern 127 may include a doped semiconductor layer. For example, the capping pattern 127 may include doped silicon. The capping pattern 127 may include an n-type dopant. In an embodiment, the upper end of the semiconductor layer 123 that comes into contact with the capping pattern 127 may be recrystallized along with the capping pattern 127 through a process such as a laser annealing process.

Figure 9A:
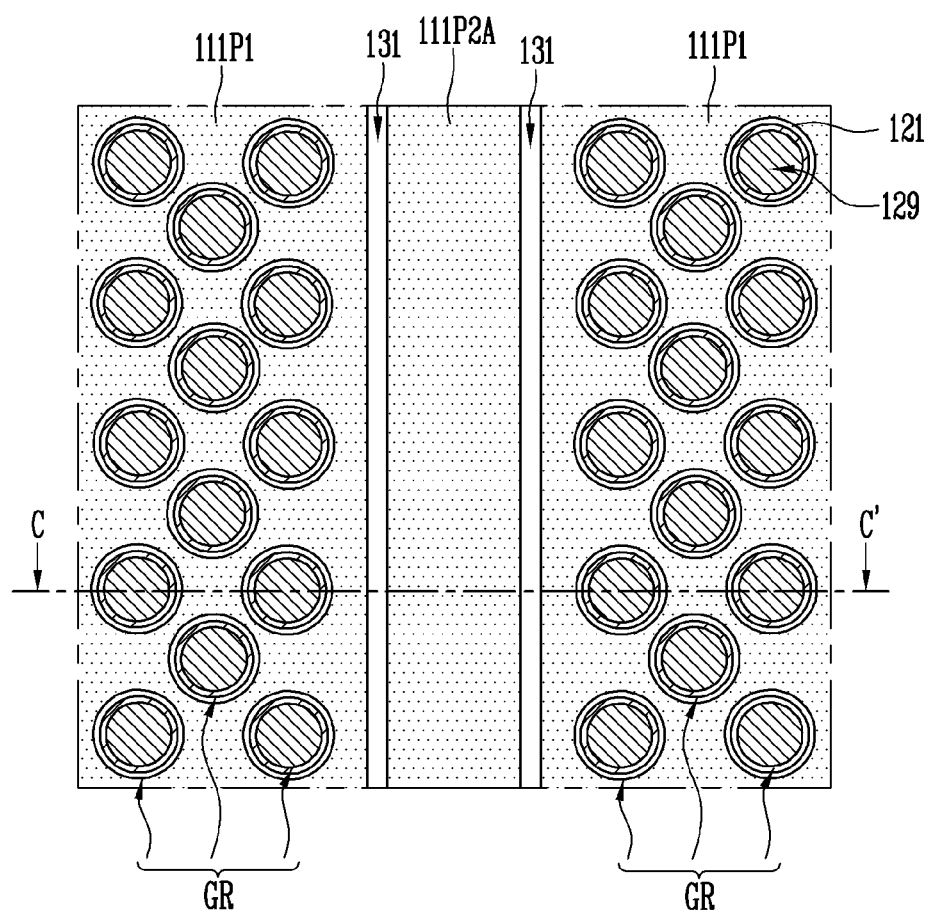
Figure 9B:
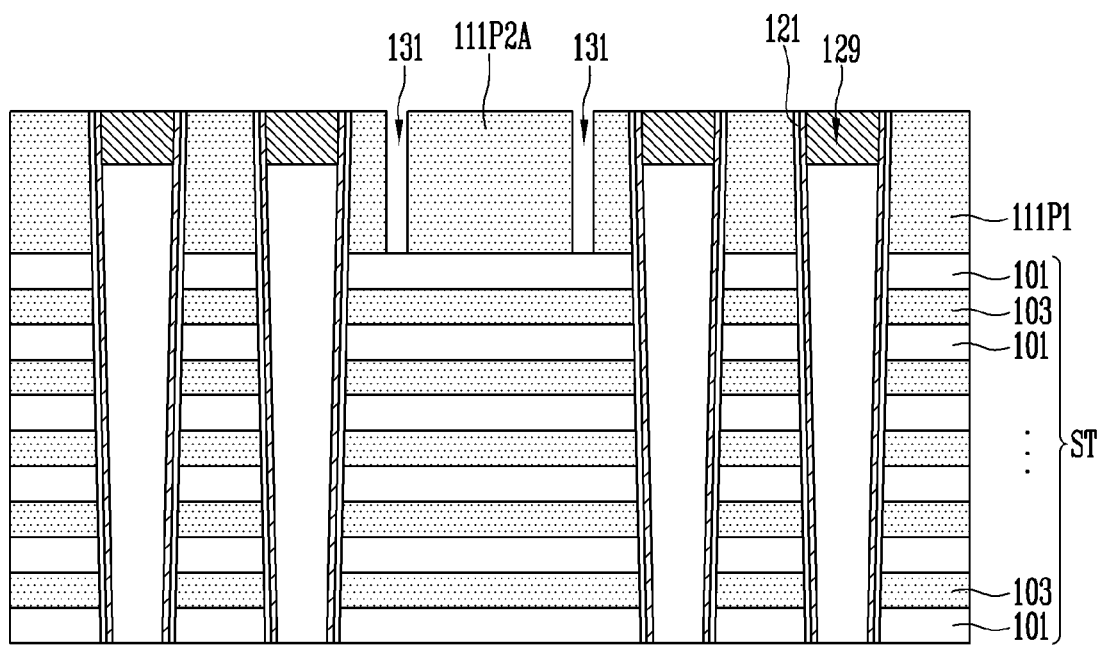

FIGS. 9A and 9B illustrate trenches 131 that pass through the etch stop layer. FIG. 9A is a plan view illustrating a layout of the channel structures 129 and the trenches 131. FIG. 9B is a sectional view taken along line C-C' of FIG. 9A.

Referring to FIGS. 9A and 9B, the trenches 131 may be formed to pass through the etch stop layer 111 illustrated in FIG. 8. Thereby, the etch stop layer may be divided into etch stop patterns 111P1 and a first dummy pattern 111P2A. Each of the etch stop patterns 111P1 may enclose channel structures 129 by group. For example, the channel structures 129 may be divided into a plurality of groups GR. Each group GR may be enclosed by the corresponding etch stop pattern 111P1.

The trenches 131 may extend parallel to each other in a boundary between the groups GR. The first dummy pattern 111P2A may be a partial area of the etch stop layer that remains between the trenches 131 adjacent to each other in the boundary between the groups GR formed of the channel structures 129.

The trenches 131 may be formed through a photolithography process. In an embodiment, the process of forming the trenches 131 may be the same process as that of forming the second slit SI2 illustrated in each of FIGS. 3A to 3D. Although not illustrated, the second slit SI2 may have a width greater than that of each trench 131, and pass through the etch stop patterns 111P1 and portion of the preliminary stack ST between the channel structures 129 of each group GR. In an embodiment, the process of forming the trenches 131 may be performed as an individual process separated from the process of forming the second slit SI2.

Figure 10A:
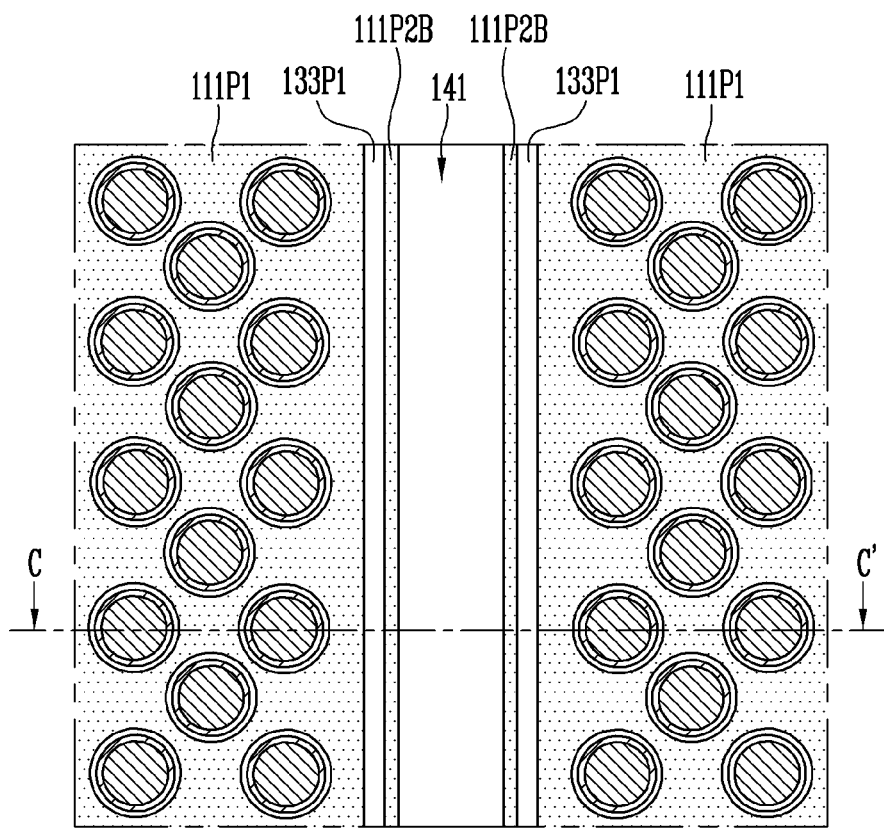
Figure 10B:
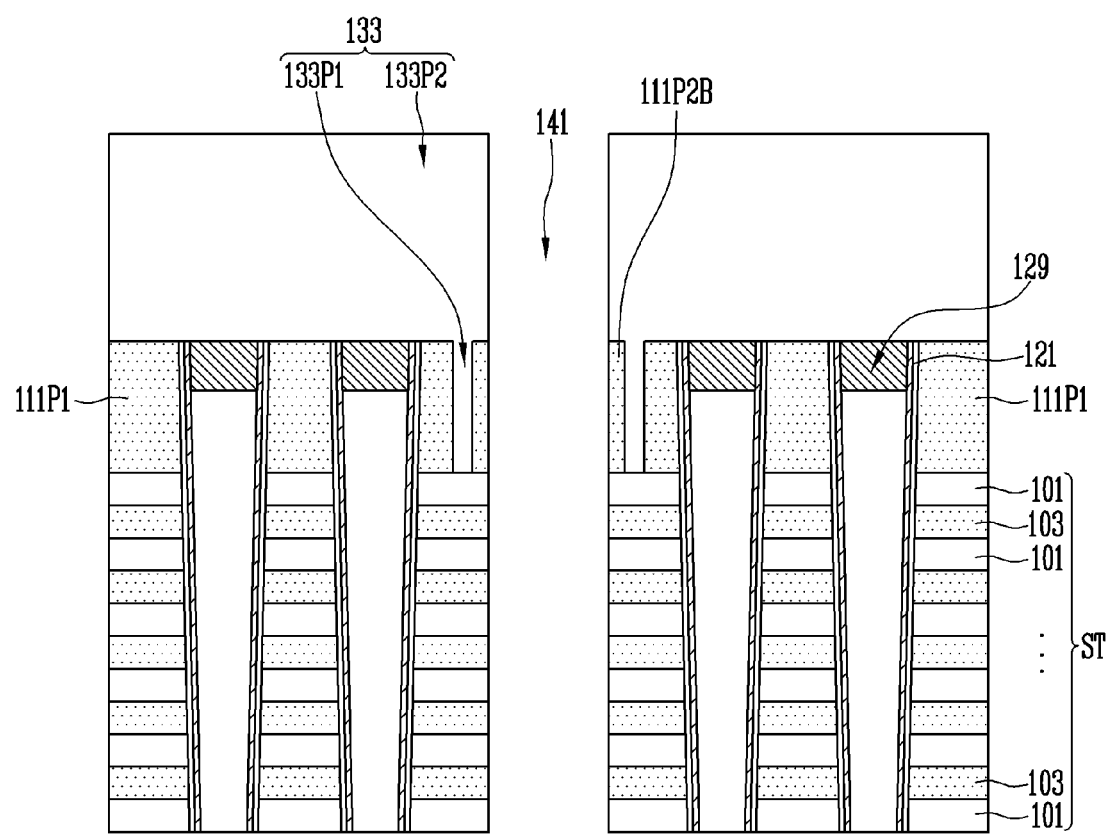

FIGS. 10A and 10B illustrate a slit 141 and an upper insulating layer 133. FIG. 10A is a plan view illustrating a layout of vertical parts 133P1 of the upper insulating layer and a layout of the etch stop patterns 111P1. FIG. 10B is a sectional view taken along line C-C' of FIG. 10A.

Referring to FIGS. 10A and 10B, the upper insulating layer 133 may be formed such that the trenches 131 illustrated in FIGS. 9A and 9B are filled with the upper insulating layer 133. The upper insulating layer 133 may be divided into vertical parts 133P1 and a horizontal part 133P2. The vertical parts 133P1 are parts of the upper insulating layer 133 that fills the trenches 131. The horizontal part 133P2 is the other part of the upper insulating layer 133 that extends from the vertical parts 133P1 to cover top surfaces of the etch stop patterns 111P1 and top surfaces of the channel structures 129. The horizontal part 133P2 may extend to cover a top surface of the first dummy pattern 111P2A illustrated in FIGS. 9A and 9B.

The upper insulating layer 133 may have an etching rate different from that of the etch stop layer 111 and the second material layers 103 that have been described with reference to FIG. 8. For example, the upper insulating layer 133 may include oxide such as a silicon oxide layer.

The upper insulating layer 133 may be penetrated by the slit 141. The slit 141 may pass through the horizontal part 133P2 of the upper insulating layer 133 between the vertical parts 133P1 that are adjacent to each other. The slit 141 may extend to pass through the first dummy pattern 111P2A illustrated in FIGS. 9A and 9B. Hence, the first dummy pattern 111P2A may be divided into second dummy patterns 111P2B by the slit 141. The second dummy patterns 111P2B may remain between the vertical parts 122P1 and the slit 141. The slit 141 may extend to pass through the preliminary stack ST that overlaps with the first dummy pattern 111P2A illustrated in FIGS. 9A and 9B. The slit 141 may be formed in a linear shape extending parallel to the vertical parts 133P1. The slit 141 may be formed through a photolithography process.

Figure 11A:
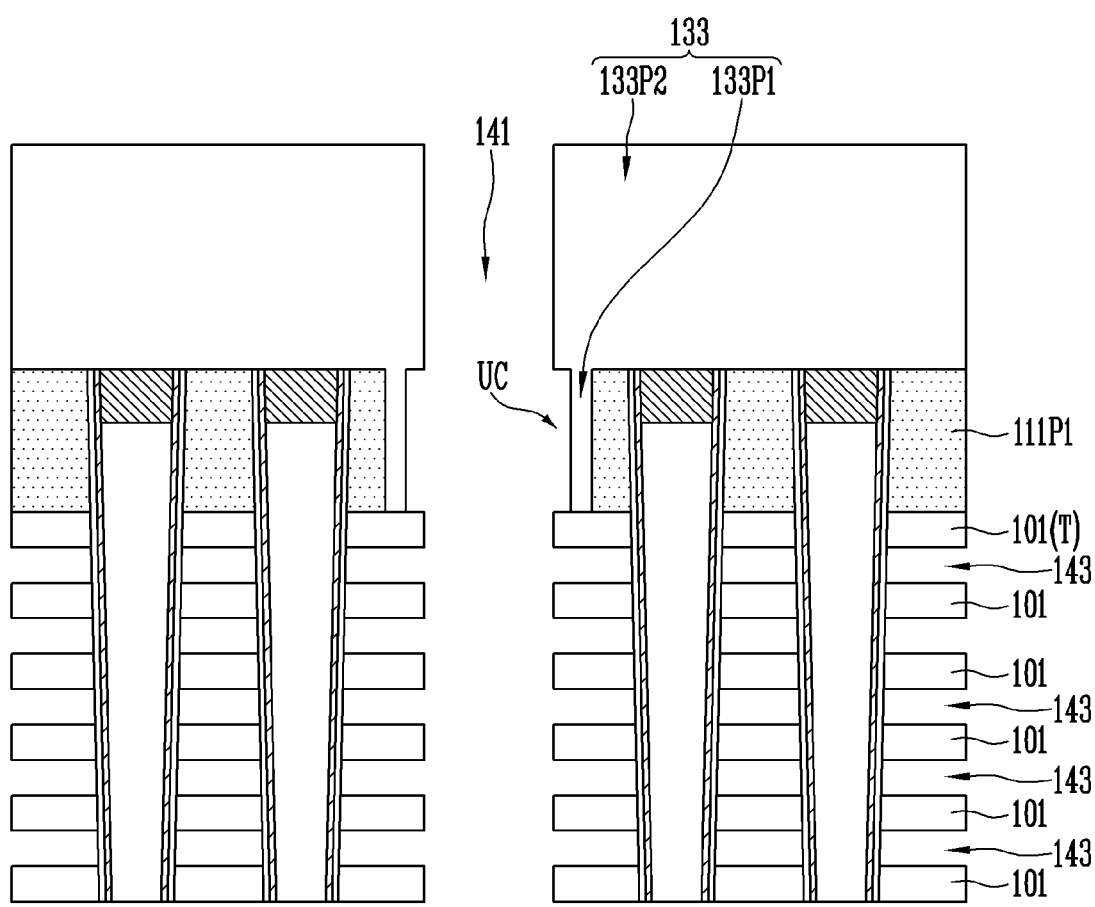
Figure 11B:
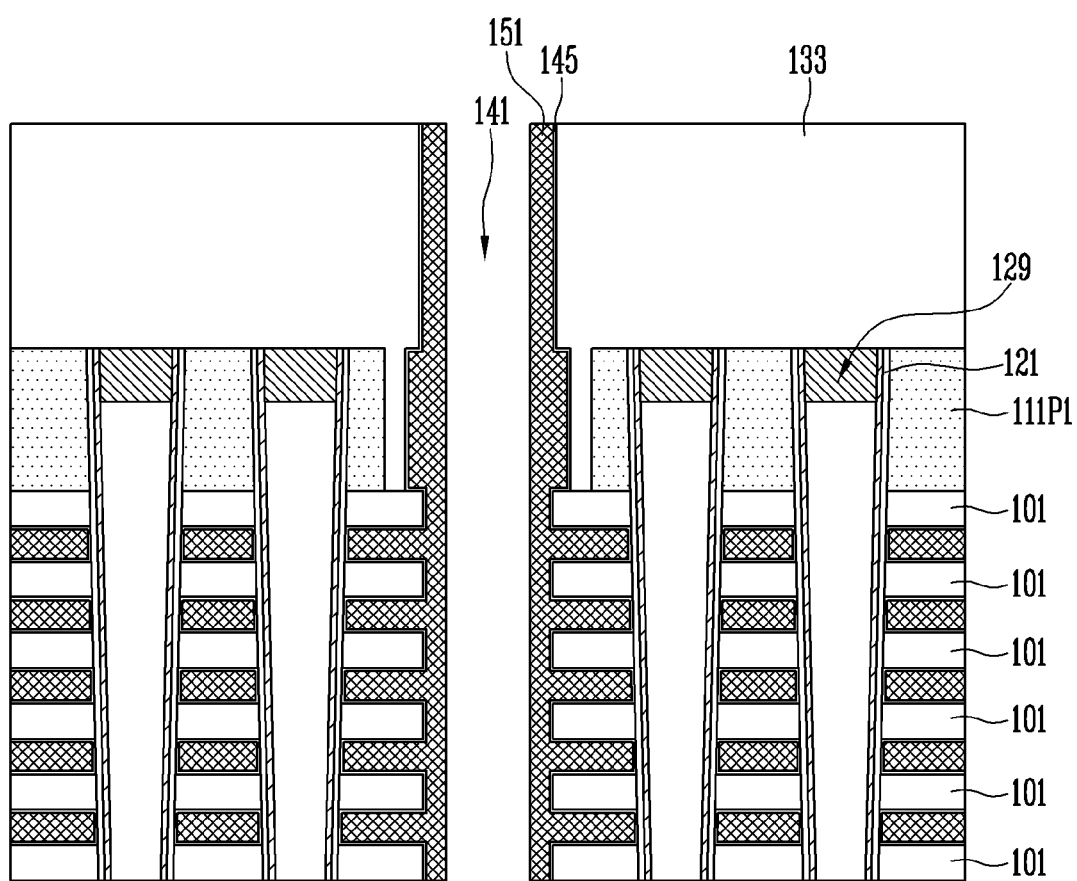
Figure 11C:
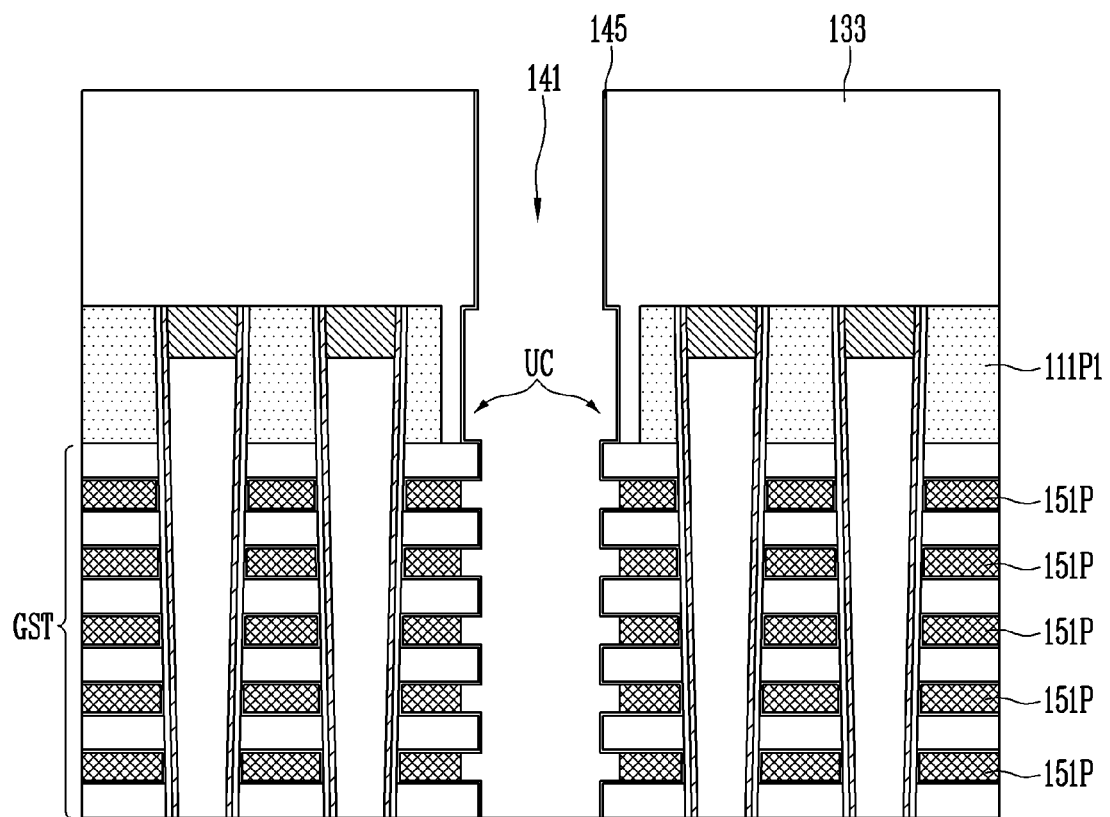

FIGS. 11A to 11C are sectional views illustrating the step of replacing the second material layers 103 illustrated in FIG. 10B with line patterns through the slit 141.

Referring to FIG. 11A, the second material layers 103 illustrated in FIG. 10B are removed through the slit 141. Thereby, as illustrated in FIG. 11A, open areas 143 are defined between the first material layers 101 that are adjacent to each other in a direction in which the first material layers 101 and the second material layers 103 that are illustrated in FIG. 10B are stacked. Because the second material layers 103 have an etching rate different from that of the first material layers 101, loss of the first material layers 101 may be minimized while the second material layers 103 are selectively removed.

While the second material layers 103 are selectively etched, the second dummy patterns 111P2B that are illustrated in FIG. 10B and exposed through the slit 141 may be removed along with the second material layers 103. Thereby, as shown in FIG. 11A, the vertical parts 133P1 of the upper insulating layer 133 may be exposed, and an undercut area UC may be defined in the sidewall of the upper insulating layer 133 that faces the slit 141. The undercut area UC may be defined by the uppermost first material layer 101(T) and the horizontal part 133P2 that remains protruding toward the slit 141 farther than each vertical part 133P1.

The upper insulating layer 133 may have an etching rate different from that of the second material layers 103. Therefore, even if the vertical parts 133P1 of the upper insulating layer 133 are exposed while the second material layers 103 are selectively removed, loss of the vertical parts 133P1 may be minimized. Furthermore, while the second material layers 103 are selectively removed, the etch stop patterns 111P1 may be protected by the vertical parts 133P1, as illustrated in FIG. 11A.

Referring to FIG. 11B, the open areas 143 illustrated in FIG. 11A may be filled with a conductive layer 151. Before the conductive layer 151 is formed, a blocking insulating layer 145 may be further formed along surfaces that define the open areas 143. The blocking insulating layer 145 may extend to cover both the respective sidewalls of the first material layers 101 that face the slit 141 and a surface of the undercut area UC illustrated in FIG. 11A. The blocking insulating layer 145 may include insulating material for blocking charges. For example, the blocking insulating layer 145 may include metal oxide. For instance, the metal oxide may include an aluminum oxide layer.

In the case where the blocking insulating layer 145 is formed, the conductive layer 151 may be formed on the blocking insulating layer 145 such that the open areas 143 illustrated in FIG. 11A are filled with the conductive layer 151. The conductive layer 151 may include at least one of a doped silicon layer, a metal silicide layer, and a metal layer. For instance, the metal layer may include low-resistance metal such as tungsten, nickel, or cobalt. The conductive layer 151 may further include a barrier layer which is conformally formed on the block insulating layer 145. The barrier layer may include a metal nitride layer. For example, the metal nitride layer may include a titanium nitride, a tantalum nitride layer, etc.

Referring to FIG. 11C, the conductive layer 151 illustrated in FIG. 11A is divided into line patterns 151P by etching the conductive layer 151. Thereby, the gate stacks GST illustrated in each of FIGS. 5A and 5B may be formed.

The line patterns 151P may correspond to the conductive patterns CPk to CPn illustrated in FIG. 5A or 5B. Portions of the block insulating layer 145 that are not covered with the line patterns 151P may be exposed through the process of etching the conductive layer 151. And a portion of the blocking insulating layer 145 that are disposed on the undercut area UC may be exposed.

Figure 12A:
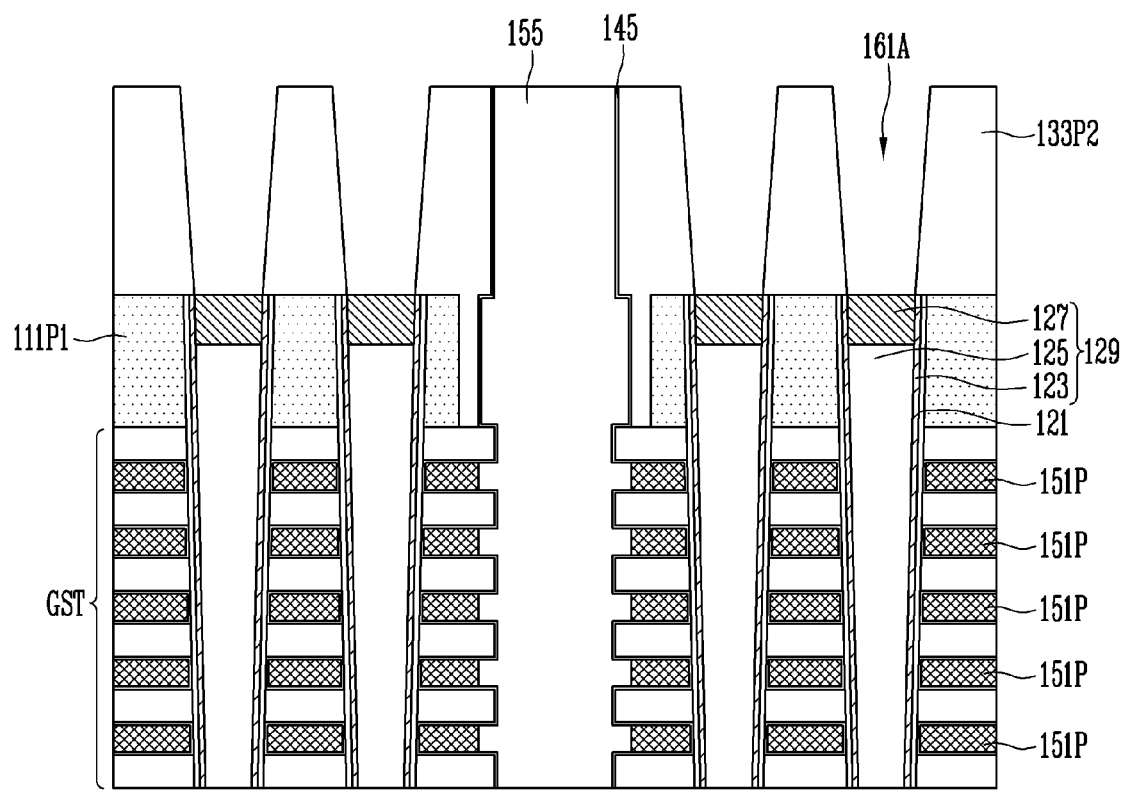
Figure 12B:
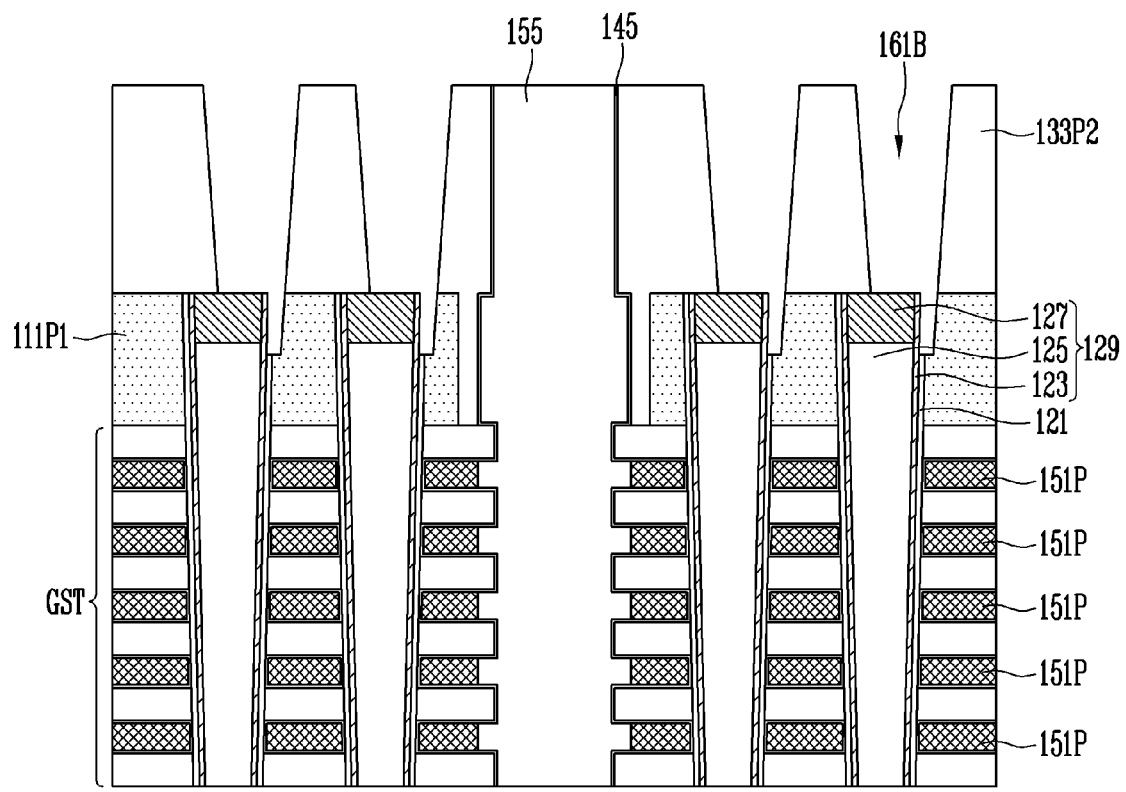

FIGS. 12A and 12B are sectional views illustrating a vertical structure 155 and contact holes 161A and 161B. FIG. 12A is a sectional view illustrating the case where the contact holes 161A are aligned with the channel structures 129 without an error, in accordance with an embodiment of the present disclosure. FIG. 12A, for example, corresponds with FIG. 5A. FIG. 12B is a sectional view illustrating the case where the contact holes 161A are biased to one side of the channel structures 129 within a margin of error, in accordance with an embodiment of the present disclosure. FIG. 12B, for example, corresponds with FIG. 5B.

Referring to FIGS. 12A and 12B, the slits 141 illustrated in FIG. 11C may be filled with the vertical structure 155. In an embodiment, the vertical structure 155 may be formed by filling the slit 141 with insulating material. In an embodiment, the step of forming the vertical structure 155 may include the step of forming a sidewall insulating layer on a sidewall of the slit 141 to cover the blocking insulating layer 145, and the step of filling conductive material into a central area of the slit 141 that is defined in the sidewall insulating layer.

The contact holes 161A and 161B may be formed by etching the horizontal part 133P2 of the upper insulating layer through a photolithography process.

As illustrated in FIG. 12A, in the case where central axes of the contact holes 161A are respectively aligned with central axes of the channel structures 129, each capping pattern 127 may be exposed through the corresponding contact hole 161A. Here, the capping pattern 127 may function as an etch stop layer.

As illustrated in FIG. 12B, in the case where the contact holes 161B are biased to one side of the channel structures 129, not only the capping patterns 127 but also the sidewalls of the semiconductor layers 123 may be exposed through the corresponding contact holes 161B. Here, the capping patterns 127 and the etch stop patterns 111P1 may function as etch stop layers.

For example, if the etch stop patterns 111P1 are not formed, the gate stack GST may be exposed during a process of forming the contact holes 161B passing through the first upper insulating layer 133. In this case, a punch failure may be caused. For example, a topmost line pattern 151P of the gate stack GST may be exposed through the contact holes 161B by the punch failure. To prevent the punch failure, the lengths of the upper ends of the channel structures 129 that protrude farther than the gate stack GST may be increased. In this case, at the step of removing portion of the core insulating layer 125 in each hole described with reference to FIG. 8, it may be difficult to control the etching rates of the core insulating layers 125 for the respective holes to be uniform. In this case, because it is difficult to uniformly form the capping pattern 127 in each hole, operational characteristics of the semiconductor device may be degraded.

In an embodiment of the present disclosure, even if the height of the upper end of each channel structure 129 that protrudes farther than the gate stack GST is excessively increased, the etch stop patterns 111P1 may be used as etch stop layers while the contact holes 161B are formed. Therefore, in an embodiment of the present disclosure, the gate stack GST may be prevented from being exposed through the contact holes 161B, whereby a punch failure may be prevented. Consequently, the stability of the process of manufacturing the semiconductor device may be enhanced, and the operational characteristics of the semiconductor device may be improved.

Thereafter, the contact holes 161A and 161B illustrated in FIGS. 12A and 12B are filled with conductive material, whereby the contact plugs CT illustrated in FIGS. 5A and 5B may be formed.

In the process of manufacturing the semiconductor device in accordance with various embodiments of the present disclosure, an insulating layer disposed on an etch stop layer may include vertical parts that pass through the etch stop layer. The vertical parts of the insulating layer may protect the etch stop layer during the process of manufacturing the semiconductor device, and a depression may be formed in a sidewall of the insulating layer by the vertical parts of the insulating layer.

Due to the etch stop layer that is protected by the vertical parts and remains, even if misalignment occurs during the process of forming a contact plug passing through the insulating layer, the stability of the process may be secured. Consequently, the probability of a process failure may be reduced, and the operational reliability of the semiconductor device may be enhanced.

Figure 13:
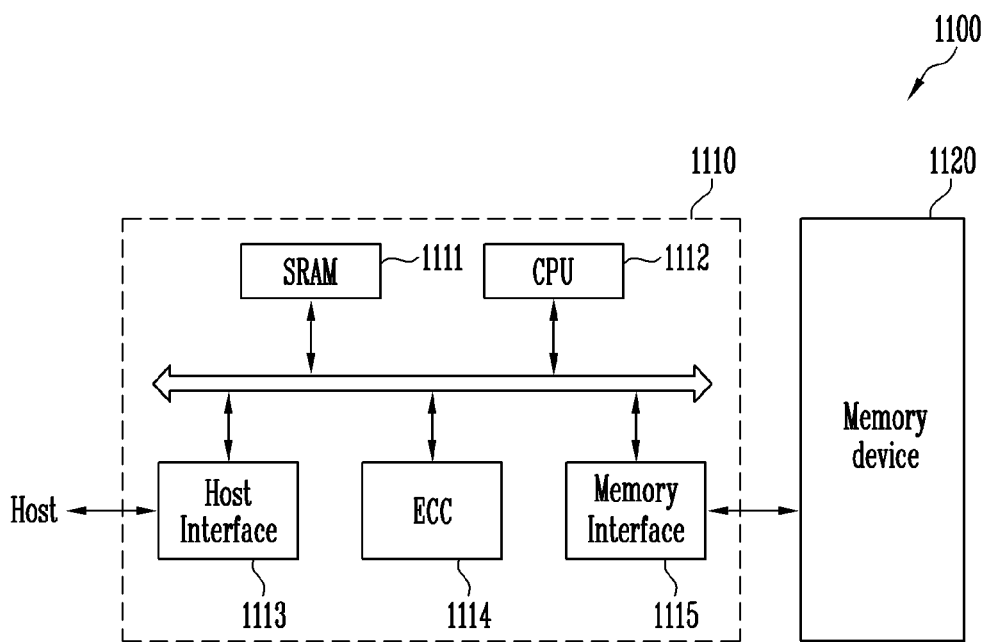
FIG. 13 is a block diagram illustrating the configuration of a memory system, in accordance with an embodiment.

FIG. 13 is a block diagram illustrating the configuration of a memory system 1100 in accordance with an embodiment of the present disclosure.

Referring FIG. 13, the memory system 1100 in accordance with an embodiment includes a memory device 1120 and a memory controller 1110.

The memory device 1120 may be a multi-chip package formed of a plurality of memory chips. The memory device 1120 may include a semiconductor memory device including at least one of the structures illustrated in FIGS. 5A and 5B.

The memory controller 1110 may control the memory device 1120, and include a static random access memory (SRAM) 1111, a CPU 1112, a host interface 1113, an error correction code circuit (ECC) 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. Furthermore, the ECC 1114 may detect and correct an error included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE) protocols.

Figure 14:
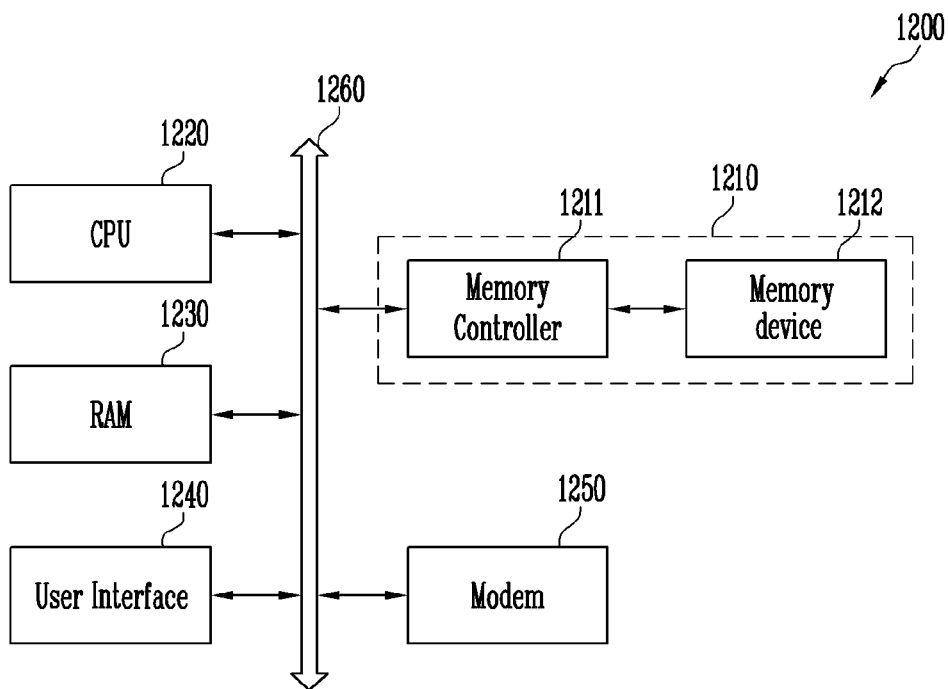
FIG. 14 is a block diagram illustrating the configuration of a computing system, in accordance with an embodiment.

FIG. 14 is a block diagram illustrating the configuration of a computing system 1200 in accordance with an embodiment of the present disclosure.

Referring to FIG. 14, the computing system 1200 in accordance with an embodiment of the present disclosure may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying an operating voltage to the computing system 1200. An application chip set, a camera image processor, a mobile DRAM and the like may be further included.

The embodiments disclosed in the present specification and the drawings just aims to help those with ordinary knowledge in this art more clearly understand the present disclosure rather than aiming to limit the bounds of the present disclosure. It is obvious to those skilled in the art that various implementations based on the technological spirit of the present disclosure are possible in addition to the disclosed embodiments.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

What is claimed is:

1. A method of manufacturing a semiconductor device, comprising:
    forming a stack including first material layers and second material layers which are alternately stacked;
    forming an etch stop layer on the stack;
    forming an insulating layer including vertical parts passing through the etch stop layer;
    forming a slit extending to pass through the etch stop layer between the vertical parts that are adjacent to each other and extending to pass through the stack, wherein the second material layers are exposed by the slit in a state in which the vertical parts of the insulating layer cover sidewalls of the etch stop layer; and
    replacing the second material layers with line patterns through the slit,
    wherein the vertical parts of the insulating layer remain to cover the sidewalls of the etch stop layer during replacing the second material layers with the line patterns.

2. The method according to claim 1,
    wherein the etch stop layer includes a material having an etching rate different from an etching rate of the insulating layer.

3. The method according to claim 1,
    wherein the etch stop layer includes a nitride, and the insulating layer includes an oxide.

4. The method according to claim 1,
    wherein the etch stop layer and the second material layers include a same material.

5. The method according to claim 1, wherein forming the insulating layer comprises:
    forming trenches passing through the etch stop layer; and
    forming the insulating layer on the etch stop layer such that the trenches are filled with the vertical parts of the insulating layer.

6. The method according to claim 1, wherein replacing the second material layers with the line patterns comprises:
    removing the second material layers through the slit such that open areas are defined between the first material layers that are adjacent to each other in a direction in which the first material layers and the second materials are stacked;

forming a blocking insulating layer on surfaces defining the open areas;

forming a conductive layer filling the open areas and disposed on the blocking insulating layer; and forming the line patterns separated from each other by etching the conductive layer.

7. The method according to claim 6, wherein removing the second material layers comprises:

removing a portion of the etch stop layer disposed between the slit and the vertical parts to expose an undercut area.

8. The method according to claim 7, wherein forming the blocking insulating layer comprises:

forming the blocking insulating layer to cover a surface of the undercut area and a sidewall of each of the first material layers facing the slit.

9. The method according to claim 1, further comprising forming a plurality of channel structures passing through the etch stop layer and the stack, wherein the insulating layer further includes a horizontal part disposed on the etch stop layer to cover the plurality of channel structures.

10. The method according to claim 9, further comprising forming a contact plug passing through the insulating layer so that the contact plug is coupled to a corresponding channel structure of the plurality of channel structures.

11. The method according to claim 1, wherein the insulating layer further includes a horizontal part disposed over a topmost surface of the stack with the etch stop layer interposed between the horizontal part and the topmost surface of the stack.

* * * * *